United States Patent
Park et al.

(10) Patent No.: US 12,016,191 B2
(45) Date of Patent: Jun. 18, 2024

(54) ELECTRONIC DEVICE INCLUDING A LIGHT-EMITTING ELEMENT HAVING FUNCTIONAL LAYERS WITH THICKNESS PROFILES

(71) Applicant: SAMSUNG DISPLAY CO., LTD., Yongin-si (KR)

(72) Inventors: Soohyun Park, Seoul (KR); Donghoon Kwak, Hwaseong-si (KR); Seulgi Han, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 291 days.

(21) Appl. No.: 17/341,205

(22) Filed: Jun. 7, 2021

(65) Prior Publication Data

US 2022/0085315 A1  Mar. 17, 2022

(30) Foreign Application Priority Data

Sep. 11, 2020  (KR) .......................... 10-2020-0116557

(51) Int. Cl.
*H01L 51/50*  (2006.01)
*H01L 27/32*  (2006.01)
(Continued)

(52) U.S. Cl.
CPC ............. *H10K 50/15* (2023.02); *H10K 50/11* (2023.02); *H10K 50/17* (2023.02); *H10K 59/122* (2023.02);
(Continued)

(58) Field of Classification Search
CPC .................................................... H10K 50/15
See application file for complete search history.

(56) References Cited

U.S. PATENT DOCUMENTS 7,223,146 B2  5/2007  Nishikawa
7,812,345 B2  10/2010  Yoshida et al.
(Continued)

FOREIGN PATENT DOCUMENTS

JP  2003-282272 A  10/2003
JP  2010-050107 A   3/2010
(Continued)

OTHER PUBLICATIONS

Parsa, Maryam et al., "Mechanisms of pattern formation from dried sessile drops", Advances in Colloid and Interface Science, 254 (2018) pp. 22-47.

*Primary Examiner* — Peter Bradford
(74) *Attorney, Agent, or Firm* — Lewis Roca Rothgerber Christie LLP

(57) ABSTRACT

An electronic device includes a base layer, a first electrode disposed on the base layer, a pixel defining layer disposed on the base layer and having an opening that exposes an upper surface of the first electrode, a hole transport region disposed in the opening and having a thickness that gradually decreases from a center of the opening toward a side surface of the pixel defining layer, an emission layer disposed on the hole transport region and having a thickness that gradually increases from the center of the opening toward the side surface of the pixel defining layer, an electron transport region disposed on the emission layer, and a second electrode disposed on the electron transport region. This electronic device may increase a light-emitting area exhibiting uniform (or substantially uniform) light-emitting characteristics and exhibit high light-emitting efficiency.

20 Claims, 12 Drawing Sheets
(1 of 12 Drawing Sheet(s) Filed in Color)

(51) Int. Cl.
  *H10K 50/11* (2023.01)
  *H10K 50/15* (2023.01)
  *H10K 50/17* (2023.01)
  *H10K 59/122* (2023.01)
  *H10K 59/35* (2023.01)
  *H10K 101/40* (2023.01)
  *H10K 102/00* (2023.01)

(52) U.S. Cl.
  CPC ......... *H10K 59/35* (2023.02); *H10K 2101/40* (2023.02); *H10K 2102/351* (2023.02)

(56) References Cited

U.S. PATENT DOCUMENTS

| | | |
|---|---|---|
| 9,231,035 B2 | 1/2016 | Kim et al. |
| 2012/0007067 A1* | 1/2012 | Kaneta .................. H10K 50/15 438/46 |
| 2013/0270532 A1* | 10/2013 | Kido ...................... H10K 50/80 257/40 |
| 2014/0070179 A1* | 3/2014 | Kim ....................... H10K 50/15 438/34 |
| 2014/0284560 A1* | 9/2014 | Shim ..................... H10K 71/00 438/34 |
| 2015/0001473 A1* | 1/2015 | Ahn ...................... H10K 71/00 438/46 |
| 2020/0044184 A1* | 2/2020 | Wan ................... H10K 59/1201 |
| 2020/0127241 A1 | 4/2020 | Kim et al. |
| 2021/0391394 A1 | 12/2021 | Lee et al. |

FOREIGN PATENT DOCUMENTS

| | | |
|---|---|---|
| JP | 4526595 B2 | 8/2010 |
| KR | 10-0564197 B1 | 3/2006 |
| KR | 10-2015846 B1 | 8/2019 |
| KR | 1020210154304 A | 12/2021 |

* cited by examiner

ELECTRONIC DEVICE INCLUDING A LIGHT-EMITTING ELEMENT HAVING FUNCTIONAL LAYERS WITH THICKNESS PROFILES

CROSS-REFERENCE TO RELATED APPLICATION

This application claims priority to and the benefit of Korean Patent Application No. 10-2020-0116557, filed on Sep. 11, 2020, the entire content of which is hereby incorporated by reference.

BACKGROUND

One or more embodiments of the present disclosure herein relate to an electronic device, and more particularly, to an electronic device including a light-emitting element having stacked functional layers.

In manufacturing a light-emitting element included in various electronic devices, for example, multimedia devices such as televisions, cellular phones, tablet computers, navigations, and/or game consoles, manufacturing methods including an inkjet printing method have been used.

However, using a coating method such as an inkjet printing method causes the film properties of functional layers constituting a light-emitting element to be non-uniform due to a difference in thickness between the center portion and the edge portion of a coating layer. Accordingly, studies are being conducted on a method for manufacturing an electronic device that increases a light-emitting area in a light-emitting element and exhibits uniform light-emitting characteristics within the light-emitting area.

SUMMARY

One or more aspects of embodiments of the present disclosure are directed toward an electronic device with improved light-emitting uniformity by enhancing thickness profiles of functional layers included in a light-emitting element.

One or more aspects of embodiments of the present disclosure are also directed toward an electronic device with an increased effective (e.g., desired) light-emitting area by enhancing thickness profiles of functional layers included in a light-emitting element.

One or more embodiments of the present disclosure provide an electronic device including a base layer; a first electrode disposed (e.g., provided, located, or arranged) on the base layer; a pixel defining layer disposed on the base layer and having an opening defined therein that exposes an upper surface of the first electrode; a hole transport region disposed in the opening and having a thickness gradually decreasing from a center of the opening toward a side surface of the pixel defining layer; an emission layer disposed on the hole transport region and having a thickness gradually increasing from the center of the opening toward the side surface of the pixel defining layer; an electron transport region disposed on the emission layer; and a second electrode disposed on the electron transport region.

In one or more embodiments, in a cross-section normal (e.g., perpendicular) to the first electrode (e.g., in a thickness direction of the first electrode) with respect to a virtual center line which passes through the center of the opening and is normal to the first electrode, provided that a total cross-sectional area of the hole transport region disposed in the opening is 100%, an average thickness of the hole transport region from the center line and spread to about 60% of the total cross-sectional area may be greater than an average thickness of the hole transport region from the center line and spread to about 80% of the total cross-sectional area.

In one or more embodiments, an upper surface of the hole transport region may be a curved surface convex toward the emission layer.

In one or more embodiments, in a cross-section normal to the first electrode with respect to a virtual center line which passes through the center of the opening and is normal to the first electrode, and provided that a total cross-sectional area of the emission layer disposed in the opening is 100%, an average thickness of the emission layer from the center line and spread to about 60% of the total cross-sectional area may be smaller than an average thickness of the emission layer from the center line and spread to about 80% of the total cross-sectional area.

In one or more embodiments, a lower surface of the emission layer may be a curved surface concave toward an upper surface of the emission layer, and the upper surface of the emission layer may be a flat surface.

In one or more embodiments, a percentage difference between a sum of a thickness of a first portion of the hole transport region measured at a virtual center line, which passes through the center of the opening and is normal to the first electrode, and a thickness of a second portion of the emission layer measured at the virtual center line, and a sum of a thickness of a third portion of the hole transport region and a thickness of a fourth portion of the emission layer respectively measured at a virtual outer peripheral line parallel to the virtual center line may be less than about 10%.

In one or more embodiments, the hole transport region may include a hole injection layer disposed on the first electrode and a hole transport layer disposed on the hole injection layer, the hole injection layer having a thickness gradually decreasing from the center of the opening toward the side surface of the pixel defining layer.

In one or more embodiments, the hole transport layer may have a thickness gradually decreasing from the center of the opening toward the side surface of the pixel defining layer.

In one or more embodiments, the upper surface of the hole injection layer may be a curved surface convex toward the emission layer, and the upper surface of the hole transport layer may be a curved surface convex toward the emission layer.

In one or more embodiments, a resistivity of the hole transport region may be lower than a resistivity the emission layer.

In one or more embodiments, the resistivity of the emission layer may be about 10 times to about 100 times the resistivity of the hole transport region.

In one or more embodiments, the side surface of the pixel defining layer defining the opening may be hydrophobic.

In one or more embodiments, the hole transport region and the emission layer may be provided by an inkjet printing method, and the electron transport region may be provided by a deposition method.

In one or more embodiments of the present disclosure, an electronic device includes a pixel defining layer in which a plurality of openings spaced apart from each other on a plane are defined, and a plurality of light-emitting elements including at least one functional layer disposed in each of the plurality of openings, wherein each of the plurality of light-emitting elements includes: a first electrode; a hole transport region disposed on the first electrode and being greater in thickness greater at a center of the hole transport region than at an outer periphery thereof; an emission layer disposed on the hole transport region and being smaller in a thickness smaller at a center of the emission layer than at an outer periphery thereof; an electron transport region disposed on the emission layer; and a second electrode disposed on the electron transport region, the center of the hole transport region and the center of the emission layer respectively corresponding to a point passing through a virtual center line normal to the first electrode, and the outer periphery of the hole transport region and the outer periphery of the emission layer respectively correspond to a point spaced apart from the center toward the pixel defining layer.

In one or more embodiments, the at least one functional layer may be provided by an inkjet printing method.

In one or more embodiments, an upper surface of the hole transport region may be a curved surface convex toward the emission layer.

In one or more embodiments, a shape of a lower surface of the emission layer may correspond to a shape of the upper surface of the hole transport region, and an upper surface of the emission layer may be a flat surface.

In one or more embodiments, in the plurality of openings, a difference between a first thickness from the first electrode to an upper portion of the emission layer at a center of an opening of the plurality of openings and a second thickness from the first electrode to the upper portion of the emission layer at an outer periphery of the opening may be less than about 10%.

In one or more embodiments of the present disclosure, an electronic device includes a plurality of light-emitting elements, each of the plurality of light-emitting elements each including: a first electrode; a hole transport region disposed on the first electrode; an emission layer disposed on the hole transport region; an electron transport region disposed on the emission layer; and a second electrode disposed on the electron transport region, wherein a first thickness of the hole transport region, which is a distance between the first electrode and the emission layer, decreases from a center of the hole transport region to an outer periphery thereof, and a second thickness of the emission layer, which is a distance between the hole transport region and the electron transport region, increases from a center of the emission layer to an outer periphery thereof.

In one or more embodiments, an upper surface of the hole transport region may be a curved surface convex toward the emission layer, and a shape of a lower surface of the emission layer may correspond to a shape of the upper surface of the hole transport region, and an upper surface of the emission layer may be a flat surface.

BRIEF DESCRIPTION OF THE FIGURES

The patent or application file contains at least one drawing executed in color. Copies of this patent or patent application publication with color drawings will be provided by the Office upon request and payment of the necessary fee.

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1:
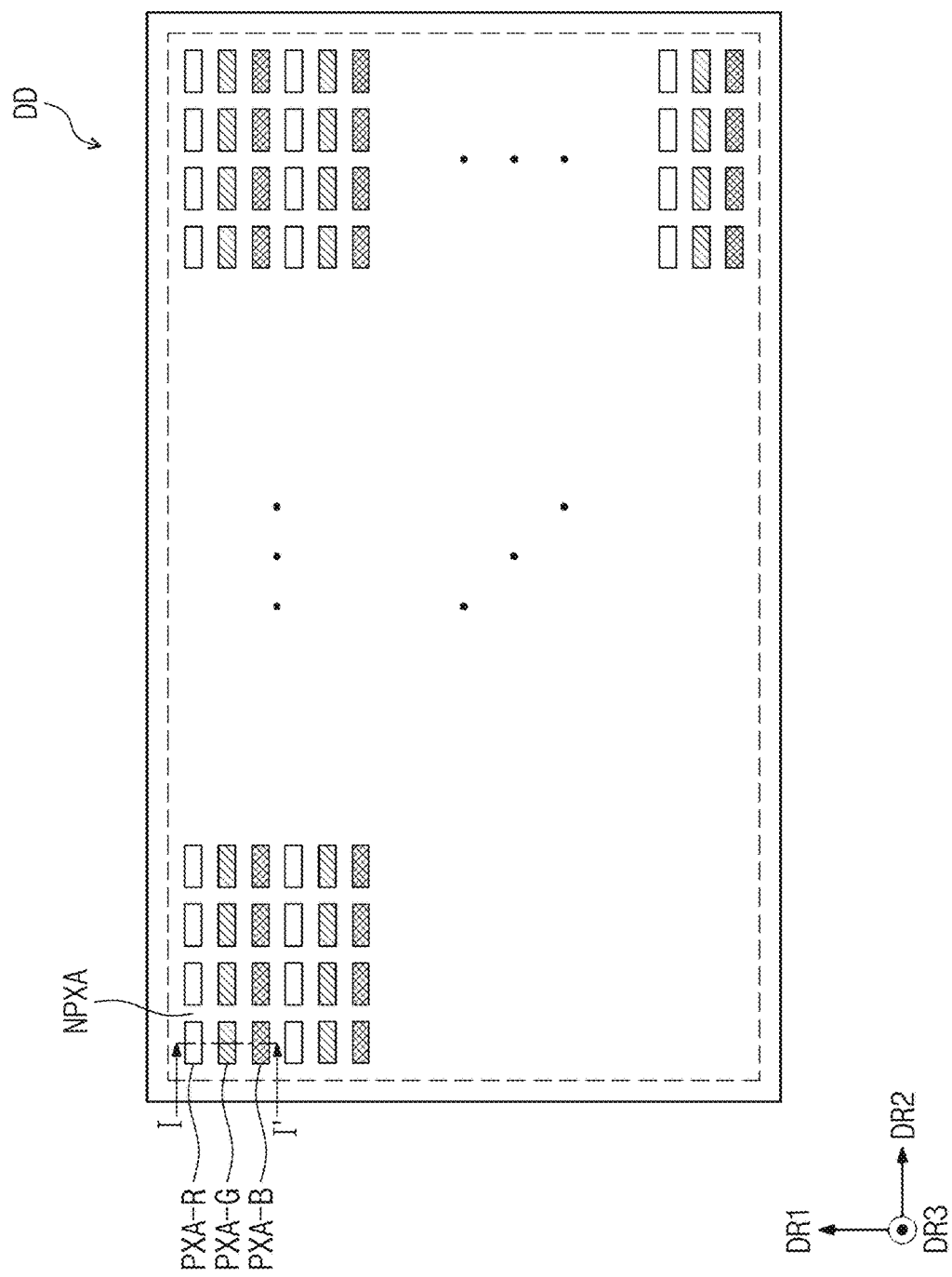
FIG. 1 is a plan view illustrating an electronic device according to one or more embodiments of the present disclosure.

The embodiments of the present disclosure are susceptible to various modifications and alternative forms, and some embodiments thereof are illustrated by way of example in the drawings and will be described herein in more detail. However, it should be understood that the present disclosure is not intended to be limited by the specific disclosed embodiments, and all modifications, equivalents, and alternatives are included within the spirit and scope of the present disclosure.

It will be understood that when an element (or region, layer, part, etc.) is referred to as being "on", "connected to", or "coupled to" another element, it can be directly on, connected or coupled to the other element or one or more third intervening elements may be present.

Meanwhile, when an element is referred to as being "directly on", it may mean that there are no additional layers, films, regions, plates, etc. between a layer, film, region, plate, etc., and another layer, film, region, plate, etc. For example, when an element is referred to as being "directly on", it may mean that there is no additional element, such as an adhesion element, between two layers or two elements.

Like reference numerals refer to like elements throughout this specification. In addition, in the figures, thicknesses, ratios, and dimensions of components are exaggerated for effective description of the technical contents.

The term "and/or" includes any and all of one or more combinations which may be defined by associated components.

As used herein, expressions such as "at least one of", "one of", and "selected from", when preceding a list of elements, modify the entire list of elements and do not modify the individual elements of the list.

Further, the use of "may" when describing embodiments of the present disclosure refers to "one or more embodiments of the present disclosure".

It will be understood that, although the terms first, second, etc., may be used herein to describe various components, these components should not be limited by these terms. These terms are only used to distinguish one component from another component. For example, a first component may be termed a second component without departing from the scope of the present disclosure, and similarly, a second component may be termed a first component. The singular forms, "a", "an" and "the" are intended to include the plural forms as well, unless the context clearly indicates otherwise.

In addition, the spatially relative terms, such as "below", "lower", "on", "upper" and the like are used herein to describe one component or feature's relationship to another component illustrated in the figures. The terms are the spatially relative descriptors and are provided based on the direction shown in the drawings. In this specification, when any member is referred to as being "disposed on", it can be disposed on an upper portion or a lower portion.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "comprise," "include" or "have" etc., when used in this specification, specify the presence of stated features, integers, steps, operations, components, or parts, but do not preclude the presence or addition of one or more other features, integers, steps, operations, components, parts, or combination thereof.

As used herein, the terms "use," "using," and "used" may be considered synonymous with the terms "utilize," "utilizing," and "utilized," respectively.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hereinafter, an electronic device according to one or more embodiments of the present disclosure will be explained in more detail with reference to the accompanying drawings.

Figure 2:
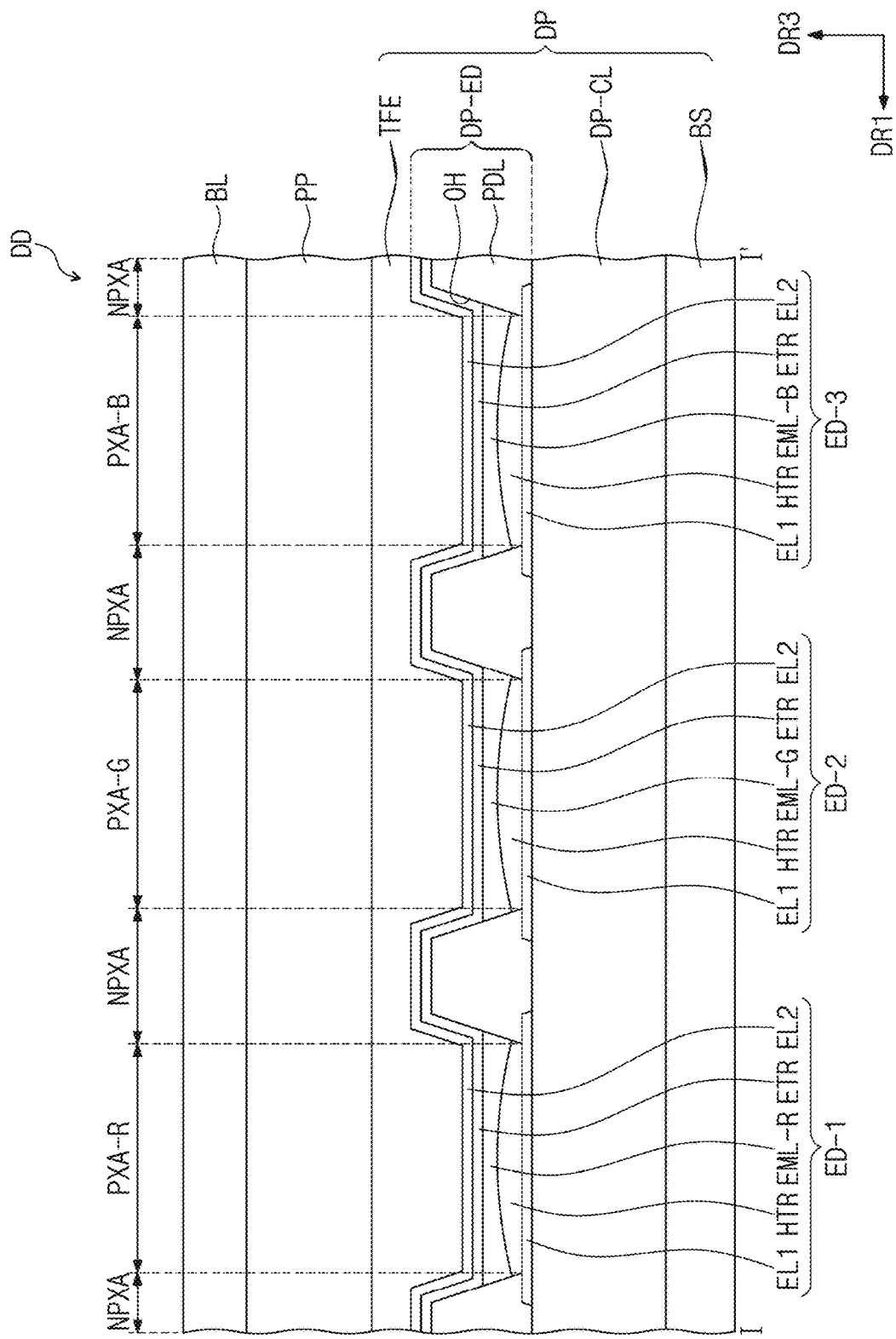
FIG. 2 is a cross-sectional view of an electronic device according to one or more embodiments of the present disclosure.
Figure 3:
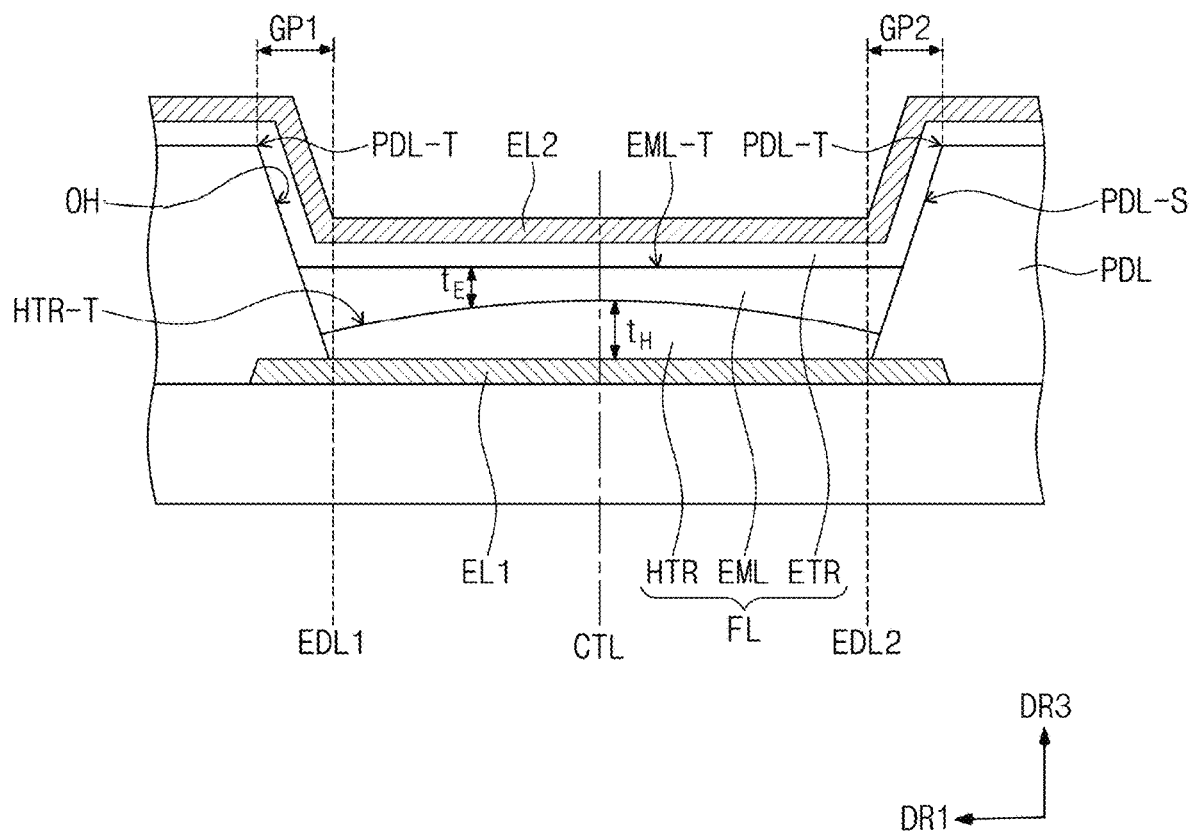
FIG. 3 is a cross-sectional view illustrating a portion of an electronic device according to one or more embodiments of the present disclosure.

FIG. 1 is a plan view illustrating an electronic device according to one or more embodiments of the present disclosure. FIG. 2 is a cross-sectional view of an electronic device according to one or more embodiments of the present disclosure. FIG. 2 is a cross-sectional view illustrating a portion taken along line I-I' in FIG. 1. FIG. 3 is a cross-sectional view illustrating a portion of an electronic device.

Referring to FIGS. 1 to 3, an electronic device DD according to one or more embodiments of the present disclosure may include a plurality of light-emitting elements ED-1, ED-2, and ED-3. In an electronic device DD according to one or more embodiments of the present disclosure, each of the light-emitting elements ED-1, ED-2, and ED-3 may include a first electrode EL1 and a second electrode EL2 that face each other, and at least one functional layer FL disposed between the first electrode EL1 and the second electrode EL2.

An electronic device DD according to one or more embodiments of the present disclosure may include a non-light emitting region NPXA and light-emitting regions PXA-R, PXA-G, and PXA-B. The light-emitting regions PXA-R, PXA-G, and PXA-B may be respectively regions in which light generated from the light-emitting elements ED-1, ED-2, and ED-3 is to be emitted. The light-emitting regions PXA-R, PXA-G, and PXA-B may be spaced apart from each other on a plane.

Each of the light-emitting regions PXA-R, PXA-G, and PXA-B may be a region separated by a pixel defining layer PDL. The non-light emitting regions NPXA may be regions interposed between the neighboring light-emitting regions PXA-R, PXA-G, and PXA-B, and may be regions corresponding to the pixel defining layer PDL.

In this specification, the light-emitting regions PXA-R, PXA-G, and PXA-B may respectively correspond to pixels. The pixel defining layer PDL may separate the light-emitting elements ED-1, ED-2, and ED-3. Emission layers EML-R, EML-G and EML-B of the light-emitting elements ED-1, ED-2 and ED-3, respectively, may be disposed and separated in an opening OH defined in the pixel defining layer PDL. In one or more embodiments of the present disclosure, a hole transport region HTR of each of the light-emitting elements ED-1, ED-2, and ED-3 may also be disposed in the opening OH defined in the pixel defining layer PDL.

The pixel defining layer PDL may be formed using a polymer resin. For example, the pixel defining layer PDL may be formed by including a polyacrylate-based resin and/or a polyimide-based resin. In one or more embodiments, the pixel defining layer PDL may be formed by further including an inorganic material, in addition to a polymer resin. In one or more embodiments, the pixel defining layer PDL may be formed by including a light-absorbing material, or may be formed by including a black pigment and/or a black dye. The pixel defining layer PDL formed by including the black pigment and/or the black dye may constitute a black pixel defining layer. When forming the pixel defining layer PDL, carbon black, etc., may be used as the black pigment and/or black dye, but embodiments of the present disclosure are not limited thereto.

In one or more embodiments, the pixel defining layer PDL may be formed using an inorganic material. For example, the pixel defining layer PDL may be formed by including silicon nitride ($SiN_x$), silicon oxide ($SiO_x$), silicon oxynitride ($SiO_xN_y$), etc. The pixel defining layer PDL may define the light-emitting regions PXA-R, PXA-G, and PXA-B. The light-emitting regions PXA-R, PXA-G, and PXA-B and the non-light emitting region NPXA may be separated by the pixel defining layer PDL.

In one or more embodiments of the present disclosure, a side surface PDL-S of the pixel defining layer PDL may be hydrophobic. The side surface PDL-S of the pixel defining layer PDL, which defines the opening OH and is in contact with the functional layer FL, may exhibit hydrophobic properties. For example, the pixel defining layer PDL itself may be formed by including a hydrophobic material, or may include a hydrophobic coating layer at least on the side surface PDL-S of the pixel defining layer PDL.

The light-emitting regions PXA-R, PXA-G, and PXA-B may be classified into a plurality of groups according to the color of light to be generated from the light-emitting elements ED-1, ED-2, and ED-3. In the electronic device DD according to one or more embodiments of the present disclosure, illustrated in FIG. 1 and FIG. 2, three light-emitting regions PXA-R, PXA-G, and PXA-B respectively to emit red light, green light, and blue light are illustrated by way of example. For example, the electronic device DD according to one or more embodiments of the present disclosure may include a red light-emitting region PXA-R, a green light-emitting region PXA-G, and a blue light-emitting region PXA-B, which are distinguished (e.g., separated) from each other.

In the electronic device DD according to one or more embodiments of the present disclosure, the plurality of light-emitting elements ED-1, ED-2, and ED-3 may emit light having different wavelength regions. For example, in one or more embodiments of the present disclosure, the electronic device DD may include a first light-emitting element ED-1 to emit red light, a second light-emitting element ED-2 to emit green light, and a third light-emitting element ED-3 to emit blue light. For example, the red light-emitting region PXA-R, the green light-emitting region PXA-G, and the blue light-emitting region PXA-B of the electronic device DD may correspond to the first light-emitting element ED-1, the second light-emitting element ED-2, and the third light-emitting element ED-3, respectively.

However, embodiments of the present disclosure are not limited thereto, and the first to third light-emitting elements ED-1, ED-2, and ED-3 may emit light of the same wavelength region, or at least one thereof may emit light of a different wavelength region. For example, all of the first to third light-emitting elements ED-1, ED-2, and ED-3 may emit blue light.

In one or more embodiments, when all of the first to third light-emitting elements ED-1, ED-2, and ED-3 are to emit blue light, the electronic device DD may further include a light control layer disposed on a display panel DP. The light control layer may be a layer including a light conversion body such as a quantum dot or a phosphor. The light control layer may include a first light control portion corresponding to the red light-emitting region PXA-R and including a red light conversion body that converts blue light to red light, and a second light control portion corresponding to the green light-emitting region PXA-G and including a green light conversion body that converts blue light to green light.

The light-emitting regions PXA-R, PXA-G, and PXA-B in the electronic device DD according to one or more embodiments of the present disclosure may be arranged in a stripe shape (e.g., stripe pattern). Referring to FIG. 1, a plurality of red light-emitting regions PXA-R, a plurality of green light-emitting regions PXA-G, and a plurality of blue light-emitting regions PXA-B may be arranged respectively along a second direction axis DR2. In one or more embodiments, the red light-emitting region PXA-R, the green light-emitting region PXA-G, and the blue light-emitting region PXA-B may be alternatively arranged in this order along a first direction axis DR1.

FIG. 1 and FIG. 2 illustrate that all the light-emitting regions PXA-R, PXA-G, and PXA-B have similar areas, but embodiments of the present disclosure are not limited thereto. The areas of the light-emitting regions PXA-R, PXA-G, and PXA-B may be different from each other depending on the wavelength region of the emitted light. As used herein, the areas of the light-emitting regions PXA-R, PXA-G, and PXA-B may indicate areas as viewed on a plane defined by the first direction axis DR1 and the second direction axis DR2 (e.g., in a plan view).

The arrangement of the light-emitting regions PXA-R, PXA-G, and PXA-B is not limited to the configuration illustrated in FIG. 1, and the arrangement order of the red light-emitting region PXA-R, the green light-emitting region PXA-G, and the blue light-emitting region PXA-B may be provided in various suitable combinations depending on the properties of display quality required (or desired) for the electronic device DD. For example, the light-emitting regions PXA-R, PXA-G, and PXA-B may be arranged in a PenTile®/PENTILE® configuration or pattern (PENTILE® is a registered trademark owned by Samsung Display Co., Ltd.), or a diamond configuration or pattern.

In one or more embodiments, the areas of the light-emitting regions PXA-R, PXA-G, and PXA-B may be different from each other. For example, in one or more embodiments of the present disclosure, the area of the green light-emitting region PXA-G may be smaller than the area of the blue light-emitting region PXA-B, but embodiments of the present disclosure are not limited thereto.

An electronic device DD according to one or more embodiments of the present disclosure includes a display panel DP including a light-emitting element layer DP-ED. In one or more embodiments of the present disclosure, the display panel DP may include a base layer BS, a circuit layer DP-CL and a light-emitting element layer DP-ED provided on the base layer BS, and an upper insulating layer TFE disposed on the light-emitting element layer DP-ED. The light-emitting element layer DP-ED may include pixel defining layer PDL and light-emitting elements ED-1, ED-2, and ED-3 including at least one functional layer FL disposed between regions of the pixel defining layer PDL.

The base layer BS may be a member providing a base surface on which the light-emitting element layer DP-ED is disposed. The base layer BS may be a glass substrate, a metal substrate, a plastic substrate, and/or the like. However, embodiments of the present disclosure are not limited thereto, and the base layer BS may be an inorganic layer, an organic layer, or a composite material layer.

In one or more embodiments of the present disclosure, the circuit layer DP-CL is disposed on the base layer BS, and the circuit layer DP-CL may include a plurality of transistors. The transistors may each include a control electrode, an input electrode, and an output electrode. For example, the circuit layer DP-CL may include a switching transistor and a driving transistor, etc., for driving the light-emitting elements ED-1, ED-2, and ED-3 of the light-emitting element layer DP-ED.

Each of the light-emitting elements ED-1, ED-2, and ED-3 may include a first electrode EL1, a hole transport region HTR, emission layers EML-R, EML-G, and EML-B, respectively, an electron transport region ETR, and a second electrode EL2. FIG. 3 exemplarily illustrate a representative structure of one of the light-emitting elements ED-1, ED-2, and ED-3, and the same structure of the light-emitting element illustrated in FIG. 3 may be adopted by each of the light-emitting elements ED-1, ED-2, and ED-3 illustrated in FIG. 2.

Referring to FIG. 2, in one or more embodiments of the present disclosure, the hole transport region HTR and the emission layers EML-R, EML-G, and EML-B of the light-emitting elements ED-1, ED-2, and ED-3 are disposed in the respective opening OH defined in the pixel defining layer PDL, and the electron transport region ETR and the second electrode EL2 are provided as common layers in (for) all light-emitting elements ED-1, ED-2, and ED-3. However, embodiments of the present disclosure are not limited thereto. In one or more other embodiments of the present disclosure, the electron transport region ETR may be patterned and provided in each of the openings OH defined in the pixel defining layer PDL.

In one or more embodiments of the present disclosure, the hole transport region HTR and the emission layers EML-R, EML-G, EML-B of the light-emitting elements ED-1, ED-2, and ED-3 etc., may be provided by an inkjet printing method. The hole transport region HTR and the emission layers EML-R, EML-G, EML-B may be sequentially provided by using an inkjet printing method. In one or more embodiments of the present disclosure, the electron transport region ETR may be provided by using a deposition method, etc. The hole transport region HTR and the emission layers EML-R, EML-G, and EML-B formed by using an inkjet printing method may be formed by providing a hole transport material or an emission layer material as (e.g., dissolved or mixed in or with) a solvent, for example, a print layer solution, or may be formed from the hole transport material or emission layer material without a separate solvent.

The upper insulating layer TFE may be disposed on the light-emitting elements ED-1, ED-2, and ED-3. The upper insulating layer TFE may cover and seal the light-emitting elements ED-1, ED-2, and ED-3. The upper insulating layer TFE may be a thin film encapsulating layer. The upper insulating layer TFE may be a single layer or a plurality of layers that are stacked. The upper encapsulating layer TFE according to one or more embodiments of the present disclosure may include at least one inorganic film (hereinafter, an encapsulating inorganic film). The upper encapsulating layer TFE according to one or more embodiments of the present disclosure may include at least one organic film (hereinafter, an encapsulating organic film) and at least one encapsulating inorganic film.

The encapsulating inorganic film protects the light-emitting element layer DP-ED from moisture and/or oxygen, and the encapsulating organic film protects the light-emitting element layer DP-ED from foreign materials such as dust particles. The encapsulating inorganic film may include silicon nitride, silicon oxy nitride, silicon oxide, titanium oxide, aluminum oxide, and/or the like, but embodiments of the present disclosure are not particularly limited thereto. The encapsulating organic film may include an acrylic-based compound, an epoxy-based compound, and/or the like. The encapsulating organic film may include a photopolymerizable organic material, but embodiments of the present disclosure are not particularly limited thereto.

The upper insulating layer TFE may be disposed on the second electrode EL2 and may be disposed while filling the opening OH.

The electronic device DD according to one or more embodiments of the present disclosure may include a display panel DP and an optical layer PP disposed on the display panel DP. The optical layer PP may be disposed on the display panel DP and control the external light reflected on the display panel DP. The optical layer PP may include, for example, a polarization layer and/or a color filter layer. In one or more other embodiments, the optical layer PP may be omitted in the electronic device DD.

A base substrate BL may be disposed on the optical layer PP. The base substrate BL may be a member providing a base surface on which the optical layer PP is disposed. The base substrate BL may be a glass substrate, a metal substrate, a plastic substrate, and/or the like. However, embodiments of the present disclosure are not limited thereto, and the base substrate BL may be an inorganic layer, an organic layer, or a composite material layer. In one or more embodiments, the base substrate BL may be omitted.

The light-emitting element according to one or more embodiments of the present disclosure may include a first electrode EL1, a hole transport region HTR, an emission layer EML, an electron transport region ETR, and a second electrode EL2 that are sequentially stacked.

The first electrode EL1 has conductivity. The first electrode EU may be formed using a metal material, a metal alloy, or any suitable conductive compound. The first electrode EL1 may be an anode or a cathode. However, embodiments of the present disclosure are not limited thereto. For example, the first electrode EL1 may be a pixel electrode. The first electrode EL1 may be a transmissive electrode, a transflective electrode, or a reflective electrode. If the first electrode EL1 is the transmissive electrode, the first electrode EL1 may include transparent metal oxide such as indium tin oxide (ITO), indium zinc oxide (IZO), zinc oxide (ZnO), indium tin zinc oxide (ITZO), and/or the like. If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, or a compound or a mixture thereof (for example, a mixture of Ag and Mg). In one or more embodiments, the first electrode EL1 may have a multilayered structure including a reflective film or a transflective film formed using any of the above-described materials and a transparent conductive film formed using indium tin oxide (ITO), indium zinc oxide (IZO), zinc oxide (ZnO), indium tin zinc oxide (ITZO), and/or the like. For example, the first electrode EL1 may have a three-layer structure of ITO/Ag/ITO, but embodiments of the present disclosure are not limited thereto. In one or more embodiments, the first electrode EL1 may include the above-described metal material, a combination of two or more metal materials selected from the above-described metal materials, and/or oxides of any of the above-described metal materials. The thickness of the first electrode EL1 may be about 700 Å to about 10000 Å. For example, the thickness of the first electrode EL1 may be about 1000 Å to about 3000 Å.

A plurality of openings OH may be defined in the pixel defining layer PDL disposed on the base layer BS. The first electrode EL1 may be disposed on the base layer BS, and an upper surface of the first electrode EU may be exposed at (e.g. by) the opening OH. In one or more embodiments of the present disclosure, the first electrode EL1 may be disposed on the circuit layer DP-CL, and the first electrode EU may be electrically connected (e.g., coupled) to the circuit layer DP-CL.

The hole transport region HTR may be provided on the first electrode EU in the opening OH defined in the pixel defining layer PDL. In one or more embodiments of the present disclosure, the hole transport region HTR may have a single layer formed using (e.g., consisting of) a single material, a single layer formed using a plurality of different materials, or a multilayer structure having a plurality of layers formed using a plurality of different materials.

The hole transport region HTR may include a phthalocyanine compound (such as copper phthalocyanine), $N^1,N^{1'}$-([1,1'-biphenyl]-4,4'-diyl)bis($N^1$-phenyl-$N^4,N^4$-di-m-tolyl-benzene-1,4-diamine) (DNTPD), 4,4',4"-[tris(3-methylphenyl)phenylamino] triphenylamine (m-MTDATA), 4,4'4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], dipyrazino[2,3-f: 2',3'-h] quinoxaline-2,3,6,7,10,11-hexacarbonitrile (HATCN), etc.

The hole transport region HTR may include a carbazole-based derivative (such as N-phenyl carbazole and/or polyvinyl carbazole), a fluorene-based derivative, N,N'-bis(3-methylphenyl)-N,N'-diphenyl-[1,1-biphenyl]-4,4'-diamine (TPD), a triphenylamine-based derivative (such as 4,4',4"-tris(N-carbazolyl)triphenylamine (TCTA)), N,N'-di(naphthalene-1-yl)-N,N'-diphenyl-benzidine (NPB), 4,4'-cyclohexylidene bis[N,N-bis(4-methylphenyl)benzeneamine] (TAPC), 4,4'-bis[N,N'-(3-tolyl)amino]-3,3'-dimethylbiphenyl (HMTPD), 1,3-bis(N-carbazolyl)benzene (mCP), etc.

In one or more embodiments, the hole transport region HTR may include a carbazole-based derivative (such as N-phenyl carbazole and/or polyvinyl carbazole), a fluorene-based derivative, N,N'-bis(3-methylphenyl)-N,N'-diphenyl-[1,1-biphenyl]-4,4'-diamine (TPD), a triphenylamine-based derivative (such as 4,4',4"-tris(N-carbazolyl)triphenylamine (TCTA)), N,N'-di(naphthalene-1-yl)-N,N'-diphenyl-benzidine (NPB), 4,4'-cyclohexylidene bis[N,N-bis(4-methylphenyl)benzeneamine] (TAPC), 4,4'-bis[N,N'-(3-tolyl)amino]-3,3'-dimethylbiphenyl (HMTPD), 9-(4-tert-Butylphenyl)-3,6-bis(triphenylsilyl)-9H-carbazole (CzSi), 9-phenyl-9H-3,9'-bicarbazole (CCP), 1,3-Bis(N-carbazolyl)benzene (mCP), 1,3-bis(1,8-dimethyl-9H-carbazol-9-yl)benzene (mDCP), and/or the like.

In one or more embodiments, the hole transport region HTR may include at least one of monoamine compounds listed in Compound Group H below:

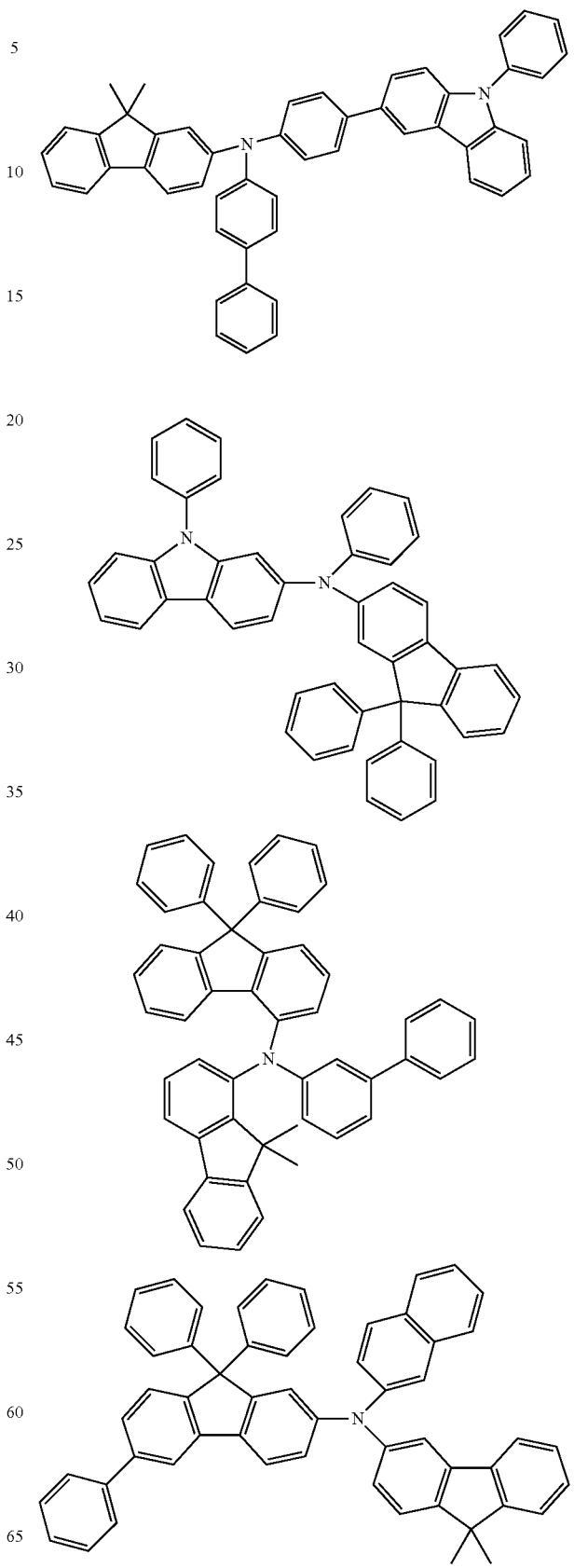

[Compound Group H]

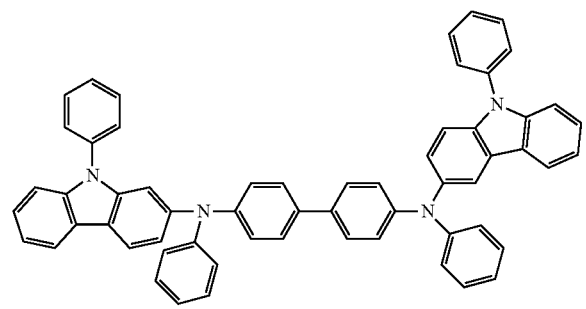
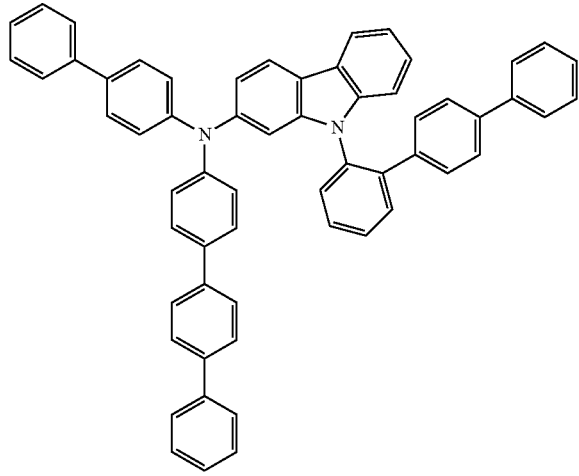
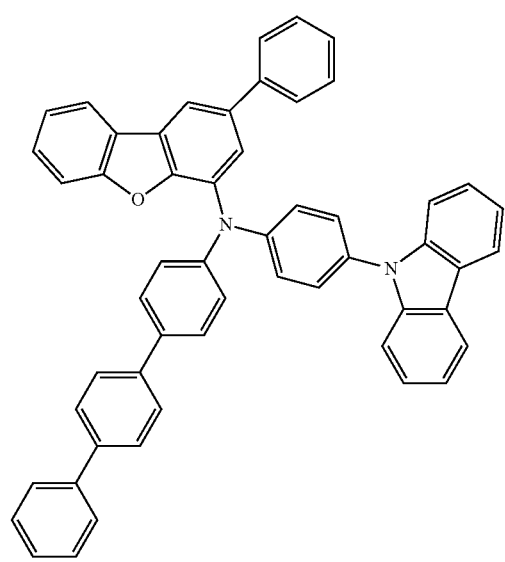
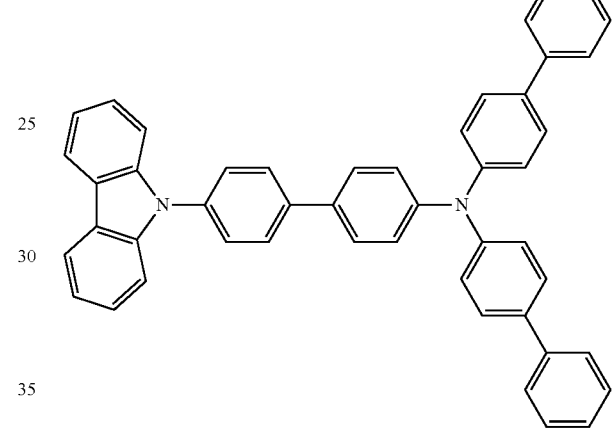
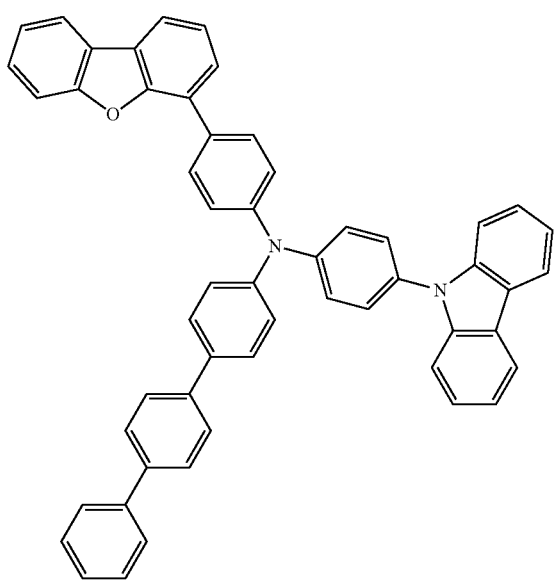
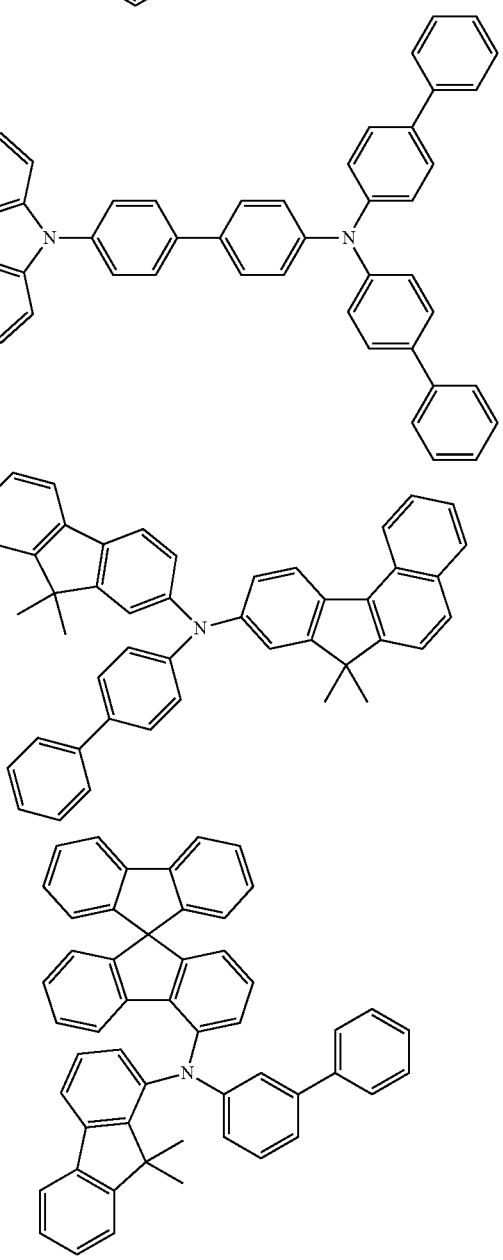

-continued

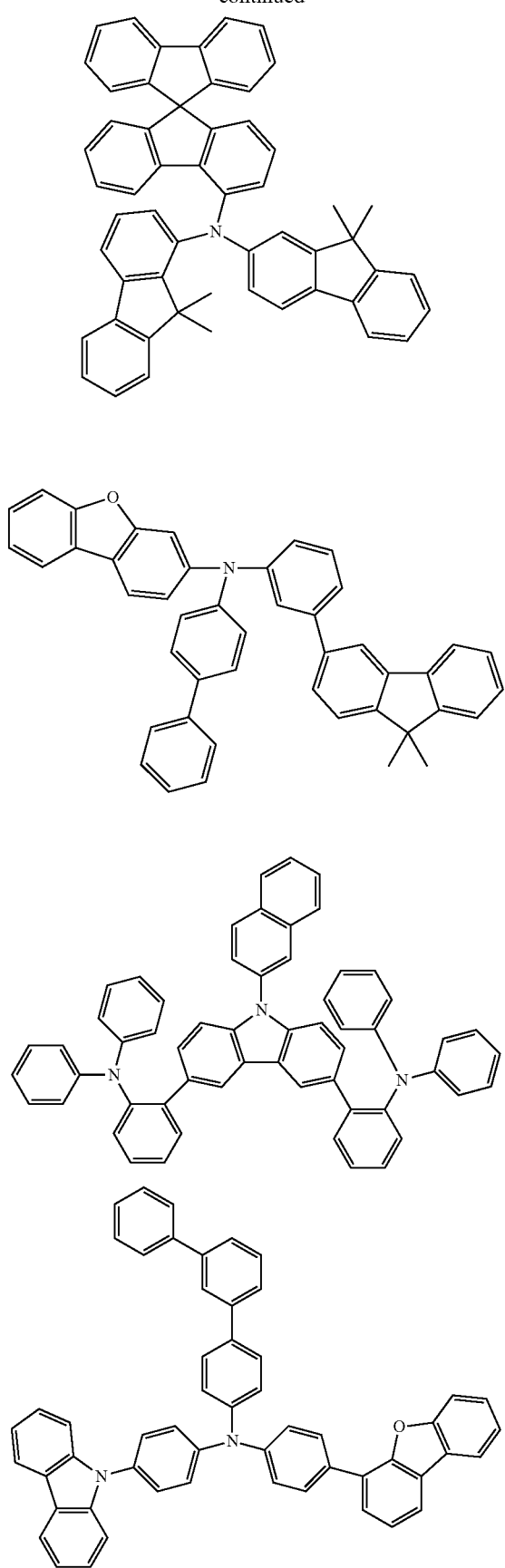

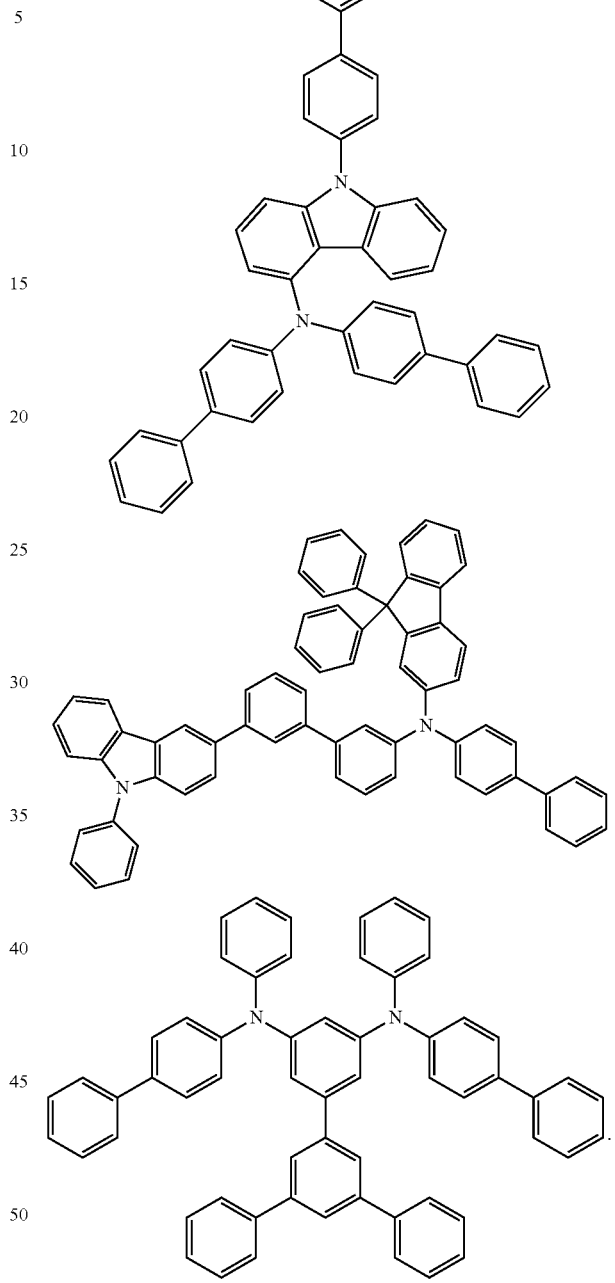

The hole transport region HTR may further include a charge generating material in addition to the above-described materials, in order to improve conductivity. The charge generating material may be uniformly or non-uniformly dispersed in the hole transport region HTR. The charge generating material may be, for example, a p-dopant. The p-dopant may include at least one among halogenated metal compounds, quinone derivatives, metal oxides, and/or cyano group-containing compounds, but embodiments of the present disclosure are not limited thereto. For example, the p-dopant may include a halogenated metal compound (such as CuI and/or RbI), a quinone derivative (such as tetracyanoquinodimethane (TCNQ) and/or 2,3,5,6-tetrafluoro-7,7,8,8-tetracyanoquinodimethane (F4-TCNQ)), metal oxide (such as tungsten oxide and/or molybdenum oxide), a cyano group-containing compound (such as dipyrazino[2,3-f: 2',3'-h] quinoxaline-2,3,6,7,10,11-hexacarbonitrile (HATCN) and/or 4-[[2,3-bis[cyano-(4-cyano-2,3,5,6-tetrafluorophenyl)methylidene]cyclopropylidene]-cyanomethyl]-2,3,5,6-tetrafluorobenzonitrile), but embodiments of the present disclosure are not limited thereto.

The hole transport region HTR may be a functional layer having a thickness that gradually decreases from the center thereof toward its outer periphery. The thickness $t_H$ of the hole transport region HTR may be defined as a distance between the first electrode EU (e.g., the surface of the first electrode EU facing the emission layer EML) and the emission layer EML facing the first electrode EL1 (e.g., the surface of the emission layer EML facing the first electrode EL1). The thickness $t_H$ of the hole transport region HTR may gradually decrease from the center passing through a virtual center line CTL passing through the center of the opening OH toward side surface PDL-S of the pixel defining layer PDL.

The hole transport region HTR on a cross-section normal (e.g., perpendicular) to the first electrode EL1 (e.g., normal to a plane defined by a first direction axis DR1 and a second direction axis DR2) may have a dome shape in which a central portion thereof is convex (e.g., protrudes) toward the emission layer EML. FIG. 3 illustrates a cross-section parallel to a plane defined by the first direction axis DR1 and a third direction axis DR3, and on a cross-section parallel to the plane defined by the first direction axis DR1 and the third direction axis DR3, the thickness may be greater at the center of the hole transport region HTR than at the outer peripheral portion adjacent to the side surface PDL-S of the pixel defining layer PDL. In one or more embodiments of the present disclosure, an upper surface HTR-T of the hole transport region HTR may be a curved surface convex (e.g., protruding) toward the emission layer EML.

Figure 4:
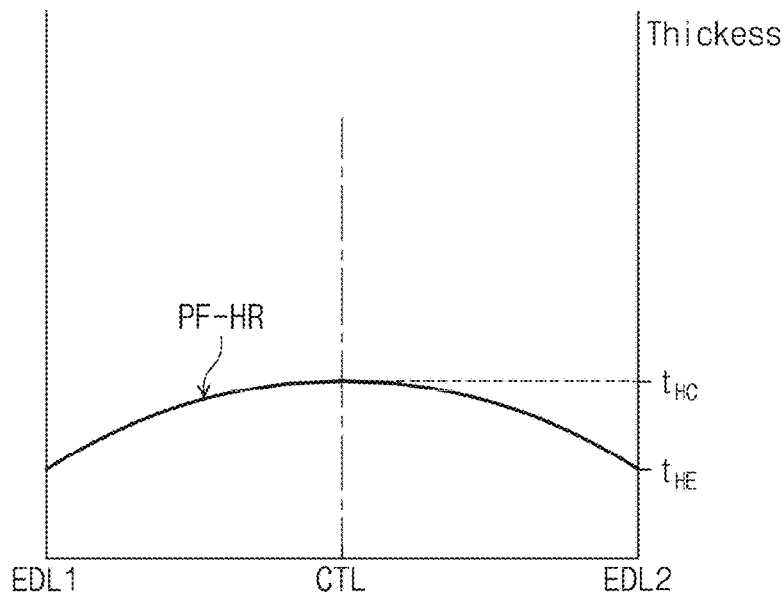
FIG. 4 is a view illustrating a thickness profile of a hole transport region in one or more embodiments of the present disclosure.

FIG. 4 is a view illustrating a thickness profile of a hole transport region HTR in one or more embodiments of the present disclosure. Referring to FIG. 3 and FIG. 4, "CTL" may be a virtual center line passing through the center of the opening OH, and "EDL1" and "EDL2" may be virtual outer peripheral lines passing through points respectively spaced apart by predetermined (or set) distances GP1 and GP2 from an upper edge PDL-T of the pixel defining layer PDL. For example, the distances GP1 and GP2 spaced apart from the upper edge PDL-T of the pixel defining layer PDL may be about 2 μm. However, embodiments of the present disclosure are not limited thereto, and "EDL1" and "EDL2" may pass through points that are spaced apart from the center (e.g., from the center line CTL) toward the pixel defining layer PDL and may pass through points that do not overlap with the pixel defining layer PDL.

The central thickness $t_{HC}$ of the hole transport region HTR in a portion passing through the center line CTL may be greater than the outer peripheral thickness $t_{HE}$ of the hole transport region HTR in a portion passing through outer peripheral lines EDL1 and EDL2. A difference between the central thickness $t_{HC}$ of the hole transport region HTR in a portion passing through the center line CTL and the outer peripheral thickness $t_{HE}$ of the hole transport region HTR in a portion passing through outer peripheral lines EDL1 and EDL2 may be about 200 Å or more. For example, an average thickness of the total hole transport region HTR may be about 1000 Å to about 1500 Å, and a difference between the central thickness $t_{HC}$ of the hole transport region HTR and the outer peripheral thickness $t_{HE}$ of the hole transport region HTR passing through the outer peripheral lines EDL1 and EDL2 may be about 200 Å.

However, embodiments of the present disclosure are not limited thereto. For example, when the average thickness of the total hole transport region HTR is less than about 1000 Å, the difference between the central thickness $t_{HC}$ of the hole transport region HTR and the outer peripheral thickness $t_{HE}$ of the hole transport region HTR passing through the outer peripheral lines EDL1 and EDL2 may be less than about 200 Å; and when the average thickness of the total hole transport region HTR is greater than about 1500 Å, the difference between the central thickness $t_{HC}$ of the hole transport region HTR and the outer peripheral thickness $t_{HE}$ of the hole transport region HTR passing through the outer peripheral lines EDL1 and EDL2 may be greater than about 200 Å.

Even when the difference between the central thickness $t_{HC}$ of the hole transport region HTR and the outer peripheral thickness $t_{HE}$ of the hole transport region HTR passing through the outer peripheral lines EDL1 and EDL2 is less than or greater than about 200 Å, the central thickness $t_{HC}$ of the hole transport region HTR may still be the greatest (e.g., largest), and the thickness of the hole transport region HTR may decrease toward the outer periphery thereof.

Referring to FIG. 4, the thickness profile PF-HR of the hole transport region may have a dome shape in which the thickness is greater at the center than at the outer periphery thereof.

The thickness profile PF-HR of the hole transport region may be symmetrical with respect to the virtual center line CTL. However, embodiments of the present disclosure are not limited thereto, for example, the thickness of the hole transport region HTR may represent the thickness profile that decreases from the center line CTL toward the outer peripheral lines EDL1 and EDL2, and a thickness of the corresponding portion to be adjacent to each of the outer peripheral lines EDL1 and EDL2 may be asymmetric with respect to center line CTL. However, even in this case, the central thickness $t_{HC}$ of the hole transport region HTR may be the greatest (e.g., largest), and the outer peripheral thickness $t_{HE}$ of the portion adjacent to outer peripheral lines EDL1 and EDL2 may be small (e.g., smaller than $t_{HC}$).

The emission layer EML is disposed on the hole transport region HTR. The emission layer EML may have a single layer formed using (e.g., consisting of) a single material, a single layer formed using a plurality of different materials, or a multilayer structure having a plurality of layers formed using a plurality of different materials.

The emission layer EML may include an organic material including a fluorescent and/or phosphorescent material to emit red, green, blue, or white light. The emission layer EML may include a low molecular weight organic material or a high molecular weight organic material.

The emission layer EML may include, as a low molecular weight organic material, various suitable organic materials including copper phthalocyanine (CuPc), N,N'-di(naphthalene-1-yl)-N,N'-diphenyl-benzidine (NPB), tris(8-hydroxyquinolinato)aluminum (Alq$_3$), and/or the like. In one or more embodiments, when the emission layer EML includes a high molecular weight organic material, the hole transport region HTR may be disposed above or below the emission layer. In this case, the hole transport region HTR may include PEDOT, and the emission layer EML may include a high molecular weight material such as poly-phenylene vinylene (PPV)-based and/or polyfluorene-based material.

In the light-emitting element according to one or more embodiments of the present disclosure, the emission layer EML may include an anthracene derivative, a pyrene derivative, a fluoranthene derivative, a chrysene derivative, a dihydrobenzanthracene derivative, and/or a triphenylene derivative. For example, the emission layers EML may include an anthracene derivative and/or a pyrene derivative.

For example, the emission layer EML may include an anthracene derivative represented by any one among Compound E1 to Compound E19 below.

E1
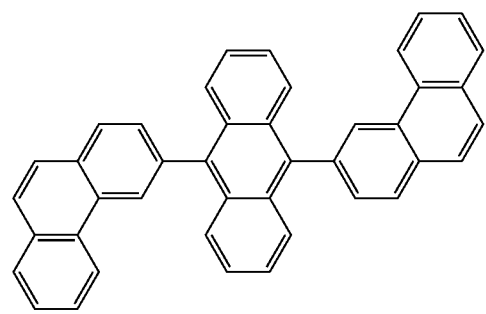

E2
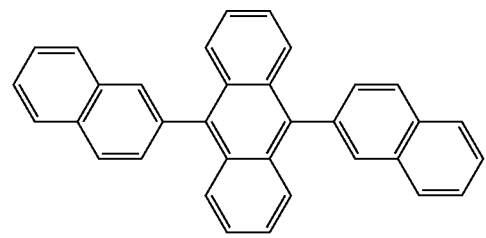

E3
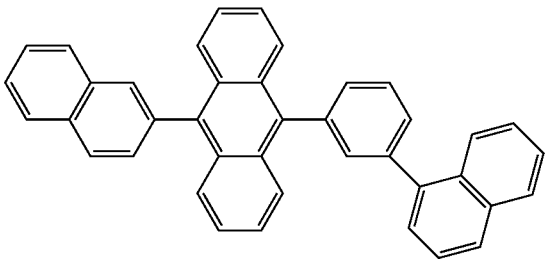

E4
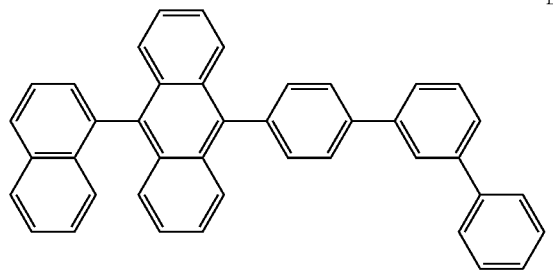

E5
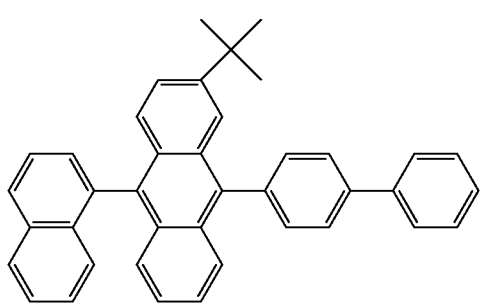

E6
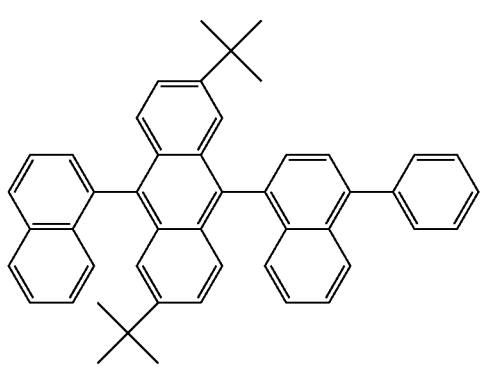

E7
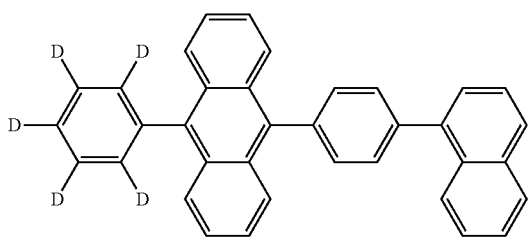

E8
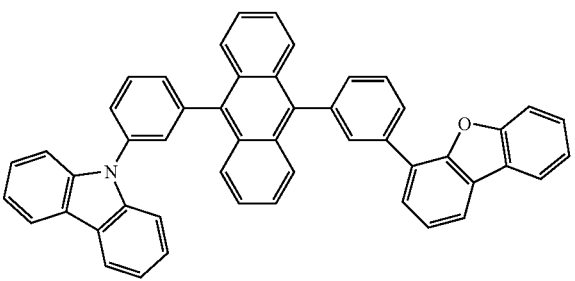

E9
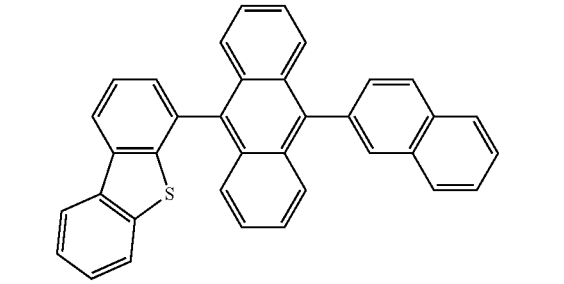

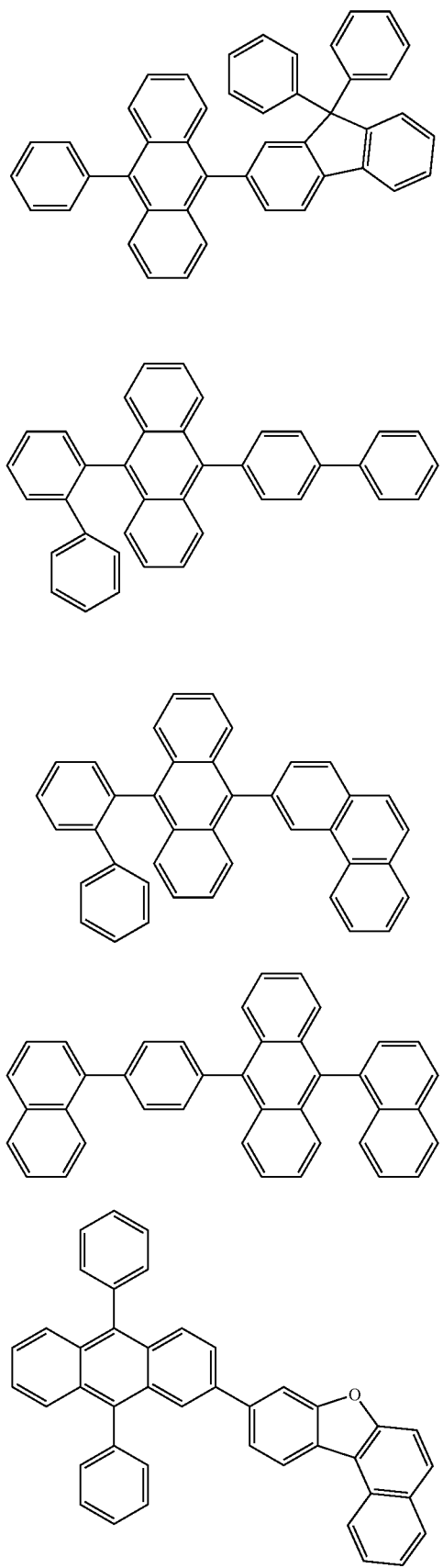
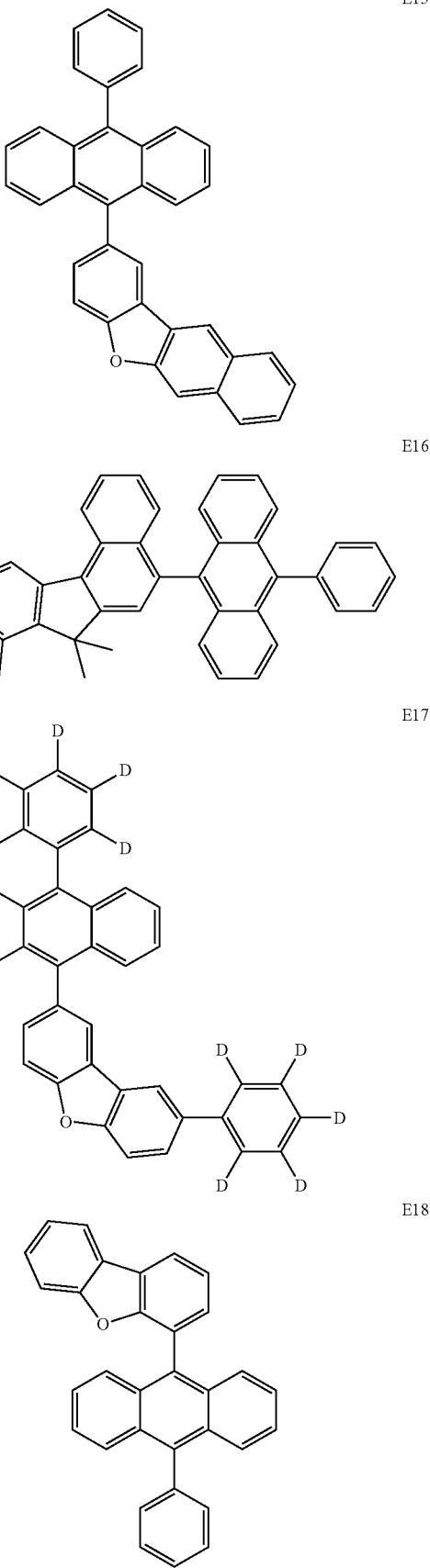

-continued

E19

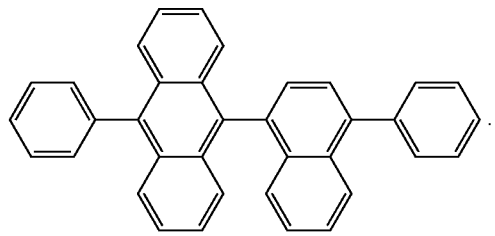

The emission layer EML may include any suitable material that can be utilized as a host material. For example, the emission layer EML may include at least one selected from among bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)triphenylamine (TCTA), and 1,3,5-tris(1-phenyl-1H-benzo[d]imidazole-2-yl)benzene (TPBi) as the host material. However, embodiments of the present disclosure are not limited thereto, and for example, tris(8-hydroxyquinolinato)aluminum (Alq$_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane (DPSiO$_3$), octaphenylcyclotetra siloxane (DPSiO4), 2,8-bis(diphenylphosphoryl)dibenzofuran (PPF), and/or the like may be used as the host material.

In one or more embodiments of the present disclosure, the emission layer EML may include, as a dopant material, a styryl derivative (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi)), and/or 4,4'-bis[2-(4-(N,N-diphenylamino)phenyl)vinyl]biphenyl (DPAVBi)), perylene and/or a derivative thereof (for example, 2,5,8,11-tetra-t-butylperylene (TBP)), pyrene and/or a derivative thereof (for example, 1,1-dipyrene,1,4-dipyrenylbenzene, and/or 1,4-bis(N,N-diphenylamino)pyrene), and/or the like.

In one or more embodiments of the present disclosure, the emission layer EML may have a thickness smaller at the center than at the outer periphery thereof. The emission layer EML may be a functional layer having a thickness that gradually increases from the center toward the outer periphery. The thickness $t_E$ of the emission layer EML may be defined as a distance between the hole transport region HTR (e.g., the surface of the hole transport region HTR that faces the electron transport region ETR) and the electron transport region ETR (e.g., the surface of the electron transport region ETR that faces the hole transport region HTR). The thickness $t_E$ of the emission layer EML may gradually increase from the center passing through the virtual center line CTL passing through the center of the opening OH toward the side surface PDL-S of the pixel defining layer PDL.

Figure 5:
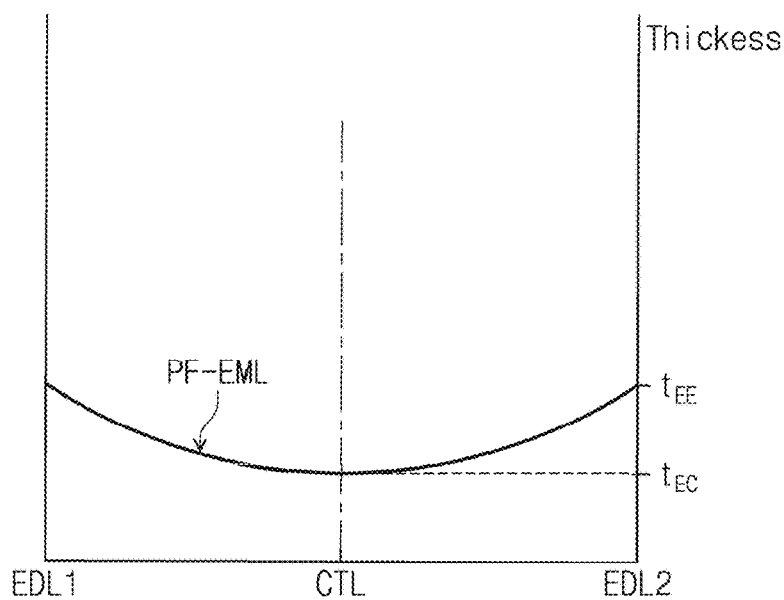
FIG. 5 is a view illustrating a thickness profile of an emission layer in one or more embodiments of the present disclosure.

FIG. 5 is a view illustrating a thickness profile of an emission layer EML in one or more embodiments of the present disclosure. In FIG. 5, "CTL" may be a virtual center line passing through the center of an opening OH, and "EDL1" and "EDL2" may be a virtual outer peripheral line passing through points spaced apart by a predetermined (or set) distance GP1 and GP2 from an upper edge PDL-T of the pixel defining layer PDL, respectively. The central thickness $t_{EC}$ of the emission layer EML is a thickness at a point on the surface of the emission layer EML through which the virtual center line CTL passes, and the outer peripheral thickness $t_{EE}$ of the emission layer EML is a thickness at points on the surface of the emission layer EML through which the virtual outer peripheral lines EDL1 and ELD2 respectively pass. Referring to FIG. 5, the thickness profile PF-EML of the emission layer may have a U-shape, wherein a thickness gradually increases from the center of the emission layer EML to the outer periphery thereof. In one or more embodiments, "EDL1" and "EDL2" may pass through points that are spaced apart from the center (e.g., from the center line CTL) toward the pixel defining layer PDL and may pass through points that do not overlap with the pixel defining layer PDL.

In one or more embodiments of the present disclosure, the central thickness $t_{EC}$ of the emission layer EML may be smaller than the outer peripheral thickness $t_{EE}$ of the emission layer EML at points on the surface of the EML through which outer peripheral lines "EDL1" and "EDL2" pass.

Referring to FIG. 3, the lower surface of the emission layer EML may have a shape corresponding to the upper surface HTR-T of the hole transport region. The lower surface of the emission layer EML may be a curved surface concave toward the upper surface EML-T of the emission layer. In one or more embodiments, the upper surface EML-T of the emission layer may be a flat (or substantially flat) surface.

Figure 6:
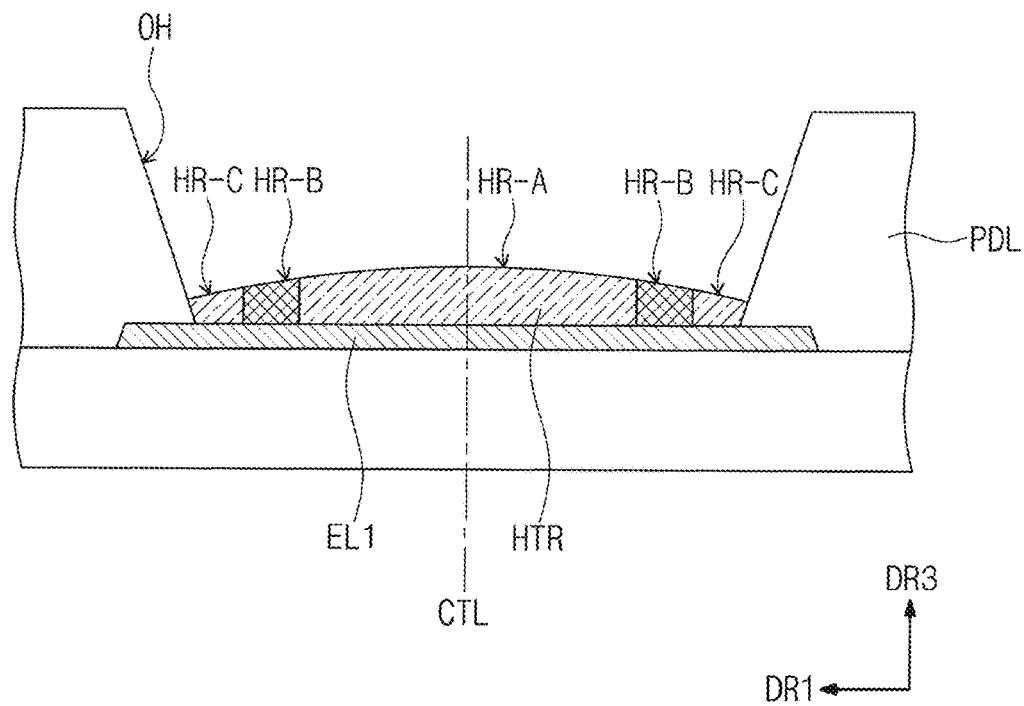
FIG. 6 is a cross-sectional view illustrating a portion of an electronic device according to one or more embodiments of the present disclosure.
Figure 7:
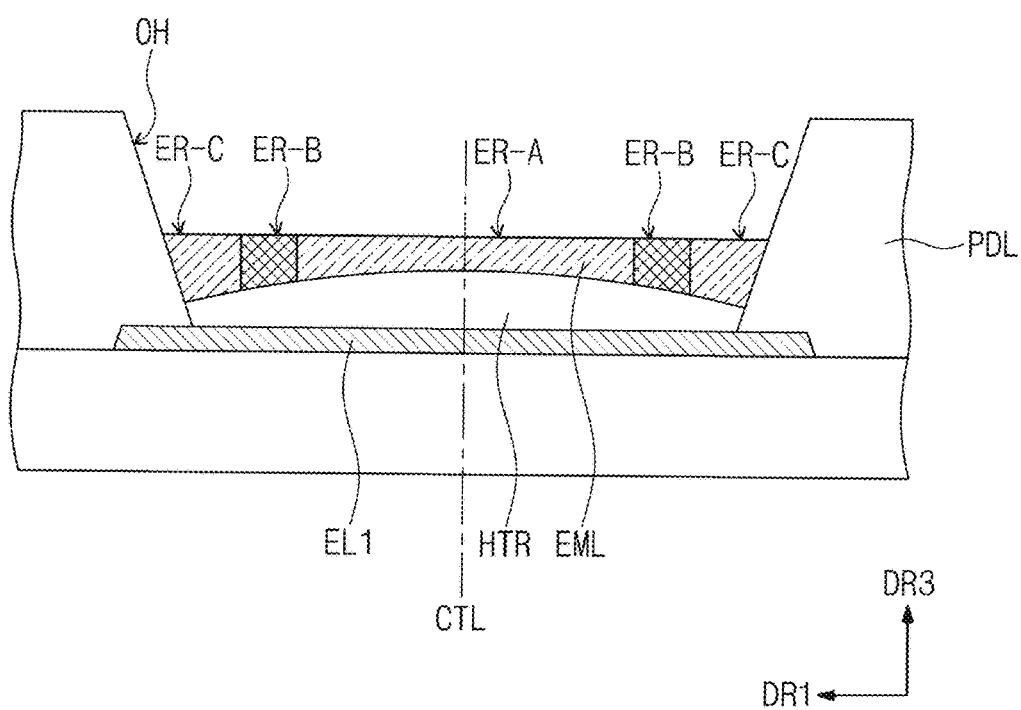
FIG. 7 is a cross-sectional view illustrating a portion of an electronic device according to one or more embodiments of the present disclosure.

FIG. 6 and FIG. 7 are each a cross-sectional view illustrating a portion of an electronic device according to one or more embodiments of the present disclosure.

FIG. 6 is a view illustrating cross-section of a light-emitting element in an embodiment of the present disclosure in which a hole transport region HTR is provided on a first electrode EL1 Referring to FIG. 6, on a cross-section normal to the first electrode EL1 (e.g., normal to the plane defined by the first direction axis DR1 and the second direction axis DR2), when the total cross-sectional area of the hole transport region HTR disposed in the opening OH is 100%, an average thickness of the hole transport region HTR in a first region HR-A having about 60% of the cross-sectional area of the hole transport region HTR may be greater than an average thickness of the hole transport region HTR in a region having about 80% of the cross-sectional area of the hole transport region HTR (including the first region HR-A and a second region HR-B). In one or more embodiments, a region having 100% of the cross-sectional area of the total hole transport region HTR may correspond to all of the first region to third region (including regions HR-A, HR-B, and HR-C).

In one or more embodiments of the present disclosure, the hole transport region HTR of the light-emitting element is characterized in that the average thickness of the first region HR-A having a cross-sectional area from (e.g., overlaps with) the center line CTL to (e.g., spread to) about 60% of the total cross-sectional area is greater than the average thickness of a region having a cross-sectional area from (e.g., overlaps with) the center line CTL to (e.g., spread to) about 80% of the total cross-sectional area (including the first region HR-A and the second region HR-B). In one or more embodiments of the present disclosure, the hole transport region HTR may have a thickness in which the average thickness of the first region HR-A having about 60% of the total cross-sectional area is greater than the average thickness of a region having about 80% of the total cross-sectional area (including the first region HR-A and the second region HR-B). For example, the hole transport region HTR may have a dome-shaped thickness profile in which the central portion is convex relative to the outer peripheral portion.

FIG. 7 is a cross-sectional view illustrating the light-emitting element of one or more embodiments of the present disclosure in which the emission layer EML is disposed on the hole transport region HTR provided in a dome shape. Referring to FIG. 7, on a cross-section normal to the first electrode EL1 (e.g., normal to the plane defined by the first direction axis DR1 and the second direction axis DR2), when a total cross-sectional area of the emission layer EML disposed in the opening OH is 100%, an average thickness of the emission layer EML in a first region ER-A having about 60% of the cross-sectional area of the emission layer EML may be smaller than an average thickness of the emission layer EML in a region having about 80% of the cross-sectional area of the emission layer EML (including the first region ER-A and a second region ER-B). In one or more embodiments, a region having 100% of the cross-sectional area of the total emission layer EML may correspond to all of the first region to third region (including ER-A, ER-B, and ER-C).

In one or more embodiments of the present disclosure, the emission layer EML of the light-emitting element is characterized in that the average thickness of the first region ER-A having a cross-sectional area from (e.g., overlaps with) the center line CTL to (e.g., and spread to) about 60% of the total area is smaller than the average thickness of a region having a cross-sectional area from (e.g., overlaps with) the center line CTL to (e.g., and spread to) about 80% of the total area (including the first region ER-A and the second region ER-B). In one or more embodiments of the present disclosure, the emission layer EML may have a thickness in which the average thickness of the first region ER-A having about 60% of the total cross-sectional area is smaller than the average thickness of a region having about 80% of the total cross-sectional area (including the first region ER-A and the second region ER-B). For example, the emission layer EML may have a U-shaped thickness profile in which the central portion is concave relative to the outer peripheral portion.

Referring back to FIG. 3, on a cross-section normal to the first electrode EL1 (e.g., normal to the plane defined by the first direction axis DR1 and the second direction axis DR2), the upper surface EML-T of the emission layer EML may be a flat (or substantially flat) surface. For example, the emission layer EML having the U-shaped thickness profile may be provided on the concave dome-shaped hole transport region HTR so that the upper surface EML-T of the emission layer EML may have a flat (or substantially flat) surface with a less than about 10% thickness difference between the center and the outer periphery thereof.

In one or more embodiments of the present disclosure, a ratio of a region having a thickness uniformity (or substantial uniformity) to the total area of the light-emitting region separated by the pixel defining layer PDL may be about 80% or more. For example, a ratio of a region having thickness uniformity (or substantial uniformity) in one light-emitting region may be defined as an IPU value is expressed in the Equation below.

$$IPU(\%) = \{\text{area of a region (minimum thickness)} \sim (\text{minimum thickness} + 150 \text{ Å})\} / \{\text{total area of a light-emitting region}\} \quad \text{Equation}$$

For example, the IPU value represents the ratio of the sum of the areas from a portion wherein the thickness from the first electrode EL1 to the upper surface EML-T of the emission layer is a minimum thickness to a portion wherein the thickness from the first electrode EL1 to the upper surface EML-T of the emission layer is a (minimum thickness+150 Å), with respect to total area of the light-emitting region disposed in the opening OH. For one or more embodiments of the present disclosure, the hole transport region HTR below the emission layer EML may have a dome-shaped thickness profile with a convex central portion, and the emission layer EML may have a U-shaped thickness profile with a thin central portion so that the upper surface EML-T of the emission layer EML may have a flat (or substantially flat) surface with a small thickness difference. For example, in one or more embodiments of the present disclosure, a region in which a thickness difference to the upper surface EML-T of the emission layer is less than 150 Å may exhibit film property of a small thickness difference over about 80% or more of the total light-emitting region.

Figure 8:
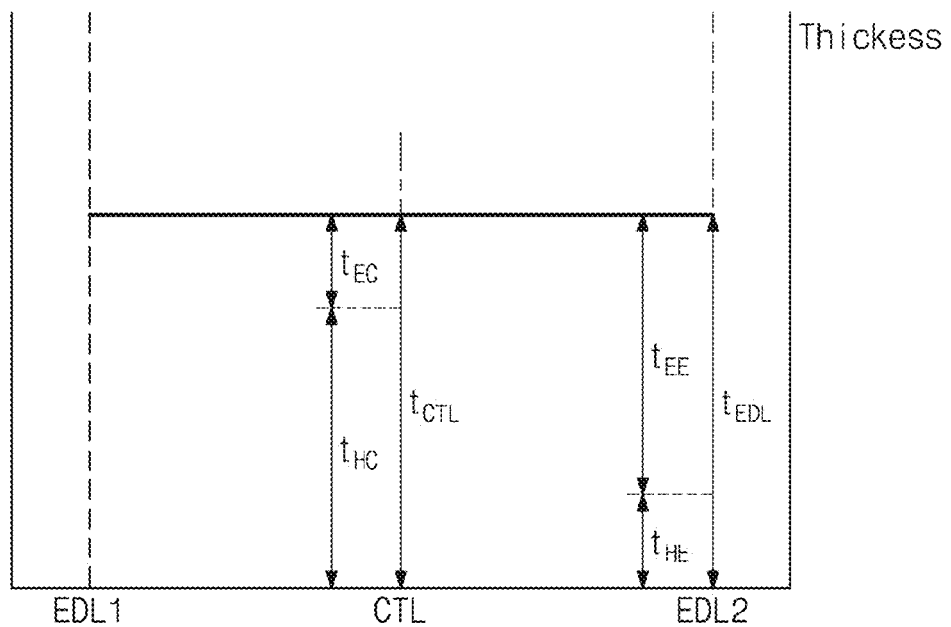
FIG. 8 is a view illustrating a thickness profile of a stacked structure up to an emission layer in one or more embodiments of the present disclosure.

FIG. 8 is a view schematically illustrating a thickness profile in an embodiment in which the hole transport region and the emission layer are stacked on the first electrode. A difference between a thickness $t_{CTL}$ at the center passing through the virtual center line CTL from the first electrode to the upper surface of the emission layer and a thickness $t_{EDL}$ at the outer periphery passing through the virtual outer peripheral lines EDL1 and EDL2 from the first electrode to the upper surface of the emission layer may be less than about 10%.

The thickness $t_{CTL}$ at the center from the first electrode to the upper surface of the emission layer corresponds to the sum of the thickness $t_{HC}$ of a portion passing through the virtual center line CTL in the hole transport region thickness and thickness $t_{EC}$ of a portion passing through the virtual center line CTL in the emission layer. In one or more embodiments, the thickness $t_{EDL}$ at the outer periphery from the first electrode to the upper surface of the emission layer corresponds to the sum of the thickness $t_{HE}$ of a portion passing through the virtual outer peripheral line EDL1 or EDL2 in the hole transport region and the thickness $t_{EE}$ of a portion passing through the virtual outer peripheral line EDL1 or EDL2 in the emission layer. The difference between the thickness $t_{CTL}$ at the center from the first electrode to the upper surface of the emission layer and the thickness $t_{EDL}$ at the outer periphery from the first electrode to the upper surface of the emission layer may be less than about 10%. That is, a difference between the sum of the thickness $t_{HC}$ of the hole transport region and the thickness $t_{EC}$ of the emission layer at the center and the sum of the thickness $t_{HE}$ of the hole transport region and the thickness $t_{EE}$ of the emission layer at the outer periphery may be less than about 10%.

In the light-emitting element according to one or more embodiments of the present disclosure described with reference to FIG. 2 and FIG. 3, a resistivity of the hole transport region HTR may be lower than a resistivity of the emission layer EML. For example, the resistivity of the emission layer EML may be about 10 times to about 100 times the resistivity of the hole transport region HTR.

The resistivity of the hole transport region HTR may be about $1.0 \times 10^6$ Ω·m to about $9.0 \times 10^6$ Ω·m, and the resistivity of the emission layer EML may be about $1.0 \times 10^7$ Ω·m to about $9.0 \times 10^7$ Ω·m. For example, the resistivity of the hole transport region HTR may be about $1.5 \times 10^6$ Ω·m to about $4.50 \times 10^6$ Ω·m, and the resistivity of the emission layer EML may be about $8.0 \times 10^7$ Ω·m to about $9.0 \times 10^7$ Ω·m. However, embodiments of the present disclosure are not limited thereto.

In one or more embodiments of the present disclosure, a conductivity of the hole transport region HTR may be greater than a conductivity of the emission layer EML. In one or more embodiments, a conductivity and a resistivity have the relationship below.

$$L(\text{conductivity}) = \frac{S(\text{cross sectional area, m}^2)}{\rho(\text{resistivity, } \Omega \cdot m) \times l(\text{distance between electrodes, } m)}$$

The resistivity value and the conductivity value may have an inverse relationship. For example, the hole transport region HTR may have low resistivity and high conductivity properties compared to the emission layer EML.

In one or more embodiments of the present disclosure, an increase in the current density at the outer peripheral portion of the light-emitting region may be controlled by increasing the thickness of the outer peripheral portion of the emission layer EML having relatively high resistivity and low conductivity. Accordingly, current loss to a non-light emitting region may be reduced so that light-emitting efficiency in the light-emitting element may be enhanced.

Referring back to FIG. 3, the electron transport region ETR may be disposed on the emission layer EML. The electron transport region ETR may have a single layer formed using (e.g., consisting of) a single material, a single layer formed using a plurality of different materials, or a multilayer structure having a plurality of layers formed using a plurality of different materials.

The electron transport region ETR may be formed by using a vacuum deposition method, and/or the like. However, embodiments of the present disclosure are not limited thereto, and the electron transport region ETR may be formed by using one or more suitable methods such as a spin coating method, a cast method, a Langmuir-Blodgett (LB) method, an inkjet printing method, a laser printing method, and/or a laser induced thermal imaging (LITI) method.

The electron transport region ETR may include, for example, tris(8-hydroxyquinolinato)aluminum (Alq$_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole ($^t$Bu-PBD), bis(2-methyl-8-quinolinolato-N1,O8)-(1,1'-biphenyl-4-olato)aluminum (BAlq), berylliumbis(benzoquinolin-10-olate (Bebq$_2$), 9,10-di(naphthalene-2-yl)anthracene (ADN), 1,3-bis[3,5-di(pyridine-3-yl)phenyl]benzene (BmPyPhB), and/or mixtures thereof.

In one or more embodiments, the electron transport region ETR may include a halogenated metal, such as LiF, NaCl, CsF, RbCl, RbI, CuI, and/or KI; a lanthanide metal such as Yb; and/or a co-deposited material of the above-described halogenated metal and lanthanide metal. For example, the electron transport region ETR may include KI:Yb, RbI:Yb, and/or the like as the co-deposited material. In one or more embodiments, the electron transport region ETR may include metal oxide such as Li$_2$O, BaO, and/or Liq(8-hydroxyl-lithium quinolate), but embodiments of the present disclosure are not limited thereto. In one or more embodiments, the electron transport region ETR may be formed using a mixture material of an electron transport material and an insulating organo metal salt. The organo metal salt may be a material having an energy band gap of about 4 eV or more. The organo metal salt may include, for example, metal acetates, metal benzoates, metal acetoacetates, metal acetylacetonates, and/or metal stearates.

The electron transport region ETR may further include, for example, at least one of 2,9-dimethyl-4,7-diphenyl-1,10-phenanthroline (BCP) or 4,7-diphenyl-1,10-phenanthroline (Bphen), in addition to the above-described materials, but embodiments of the present disclosure are not limited thereto.

A second electrode EL2 is provided on the electron transport region ETR. The second electrode EL2 may be a common electrode. The second electrode EL2 may be a cathode or an anode, but embodiments of the present disclosure are not limited thereto. For example, if the first electrode EL1 is an anode, the second electrode EL2 may be a cathode, and if the first electrode EU is a cathode, the second electrode EL2 may be an anode.

The second electrode EL2 may be a transmissive electrode, a transflective electrode or a reflective electrode. If the second electrode EL2 is the transmissive electrode, the second electrode EL2 may include transparent metal oxide such as indium tin oxide (ITO), indium zinc oxide (IZO), zinc oxide (ZnO), indium tin zinc oxide (ITZO), and/or the like.

If the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, or a compound or a mixture containing any of them (for example, AgMg, AgYb, and/or MgAg). In one or more embodiments, the second electrode EL2 may have a multilayered structure including a reflective film or a transflective film formed using any of the above-described materials and a transparent conductive film formed using indium tin oxide (ITO), indium zinc oxide (IZO), zinc oxide (ZnO), indium tin zinc oxide (ITZO), and/or the like. For example, the second electrode EL2 may include the above-described metal material, a combination of two or more metal materials selected from the above-described metal materials, and/or an oxide of the above-described metal materials.

In one or more embodiments of the present disclosure, a capping layer may be further disposed on the second electrode EL2 of the light-emitting element. The capping layer may include multiple layers or a single layer. In one or more embodiments of the present disclosure, the capping layer may be an organic layer or an inorganic layer. The refractive index of the capping layer may be about 1.6 or more. By way of example, for light in the wavelength range of about 550 nm to about 660 nm, the refractive index of the capping layer may be about 1.6 or more.

An electronic device according to one or more embodiments of the present disclosure may include a hole transport region disposed in an opening and having a thickness greater at the center thereof than at the outer periphery thereof, and an emission layer disposed on the hole transport region and having a thickness smaller at the center thereof than at the outer periphery, and an upper surface of the emission layer may include a light-emitting element having a flat (or substantially flat) surface with a less than about 10% thickness difference to exhibit excellent (e.g., improved) light-emitting uniformity within a light-emitting region. In addition, the emission layer having a relatively large thickness in an outer peripheral portion of the light-emitting region adjacent to the pixel defining layer may be included in the electronic device of one or more embodiments of the present disclosure so that leakage current flow generated when the emission layer is relatively thin may be prevented or reduced, and thus efficiency of the light-emitting element may be improved. In one or more embodiments, a thickness profile of a functional layer below the emission layer has a dome shape, and a thickness profile of the emission layer has a U-shape so that together a thickness profile of the upper surface of the emission layer may be flattened to increase light-emitting uniformity in the light-emitting region and increase area of a region exhibiting uniform (or substantially uniform) light-emitting characteristics.

Figure 9:
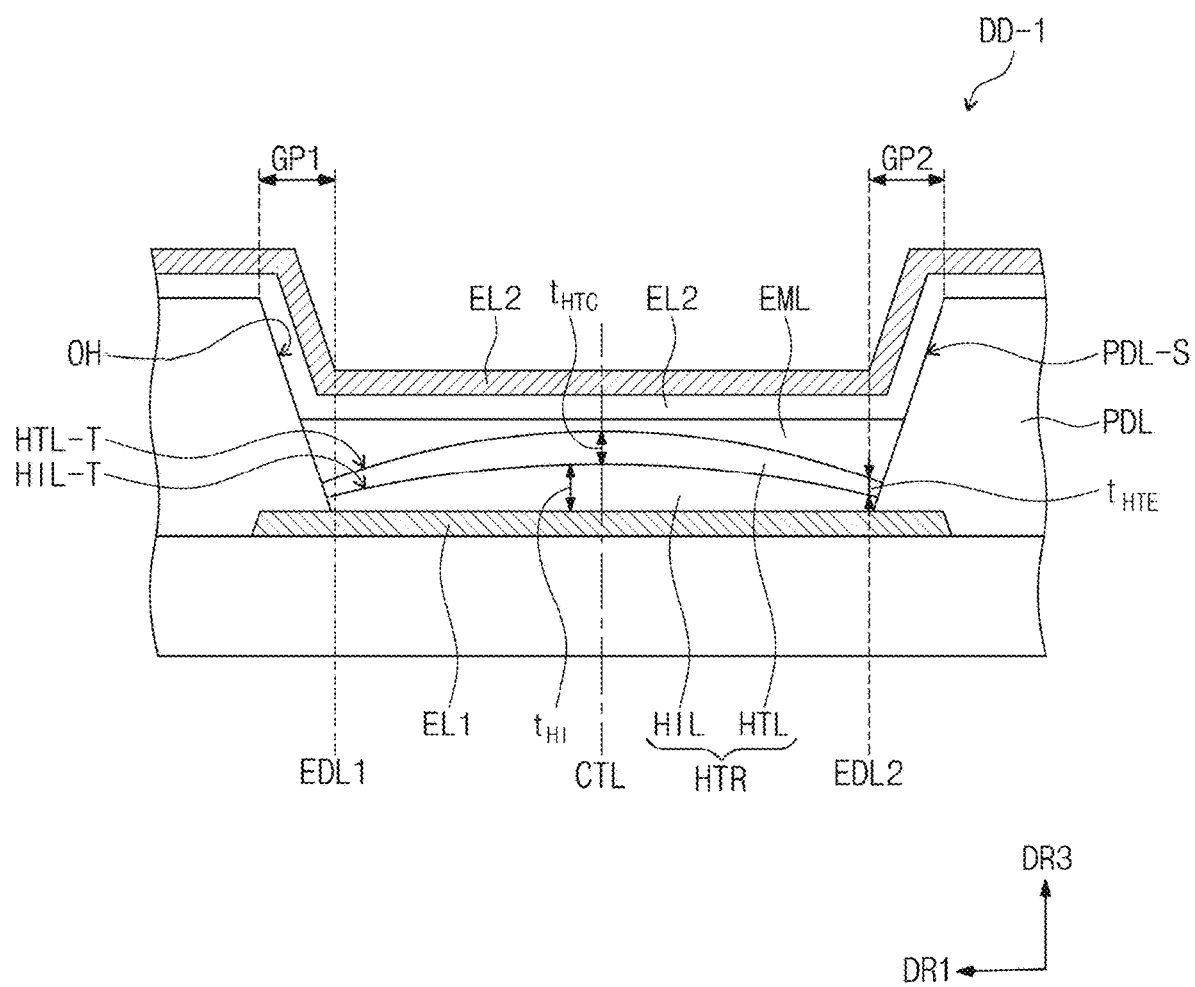
FIG. 9 is a cross-sectional view illustrating a portion of an electronic device according to one or more embodiments of the present disclosure.

FIG. 9 is a cross-sectional view illustrating a portion of an electronic device according to one or more embodiments of the present disclosure. In the description of the electronic device DD-1 according to one or more embodiments of the present disclosure described with reference to FIG. 9, the contents overlapping with those described in FIGS. 1 to 8 will not be described again, and differences will be mainly described.

In the electronic device DD-1 according to one or more embodiments of the present disclosure, the hole transport region HTR may include a hole injection layer HIL and a hole transport layer HTL. The hole injection layer HIL may be disposed on a first electrode EL1, and the hole transport layer HTL may be disposed on the hole injection layer HIL. In one or more embodiments, the hole transport region HTR may further include at least one of a buffer layer disposed between the hole injection layer HIL and the hole transport layer HTL, or an electron blocking layer disposed on an upper portion of the hole transport layer HTL.

In one or more embodiments of the present disclosure, a thickness of a hole transport region HTR including the hole injection layer HIL and the hole transport layer HTL may be greater at the center thereof than at the outer periphery. In one or more embodiments, even when the hole transport region HTR further includes at least one of the buffer layer or the electron blocking layer, the thickness may be greater at the center of the hole transport region HTR than at the outer periphery.

Referring to FIG. 9, the thickness may be greater at the center of the hole injection layer HIL than at the outer periphery of the hole injection layer HIL. The thickness of the hole injection layer HIL may gradually decrease from the center toward a side surface PDL-S of a pixel defining layer PDL. An upper surface HIL-T of the hole injection layer may be a curved surface convex toward the emission layer EML. On a cross-section disposed in the opening OH, the hole injection layer HIL may have a dome shape convex toward the emission layer EML.

In one or more embodiments of the present disclosure, the thickness of the hole injection layer HIL may be greater at the center thereof corresponding to a virtual center line CTL passing through the opening OH than at the outer periphery thereof corresponding to virtual outer peripheral lines EDL1 and EDL2 spaced apart from the pixel defining layer PDL by predetermined (or set) distances GP1 and GP2.

The hole transport layer HTL may disposed on the hole injection layer HIL, and the upper surface HTL-T of the hole transport layer may be a curved surface convex toward the emission layer EML. The lower surface of the hole transport layer HTL may have a shape corresponding to the upper surface HIL-T of the hole injection layer.

The thickness $t_{HTC}$ at the center of the hole transport layer may be greater than the thickness $t_{HTE}$ at the outer periphery of the hole transport layer. However, embodiments of the present disclosure are not limited thereto, and the thickness $t_{HTC}$ at the center of the hole transport layer may be the same as the thickness $t_{HTE}$ at the outer periphery of the hole transport layer.

The same descriptions can be applied to a first electrode EU, an emission layer EML, an electron transport region ETR, and a second electrode EL2 illustrated in FIG. 9 as those provided in connection with FIGS. 1 to 8. For example, in the electronic device DD-1 according to one or more embodiments of the present disclosure, the emission layer EML may have a thickness smaller at the center than at the outer periphery. The lower surface of the emission layer EML may have a shape corresponding to the upper surface HTL-T of the hole transport layer, and the upper surface of the emission layer EML may be a flat (or substantially flat) surface. For example, in the opening OH, a thickness difference from the first electrode EL1 to the upper surface of the emission layer EML providing a flat (or substantially flat) surface may be less than about 10%.

In the light-emitting element according to one or more embodiments of the present disclosure, the thickness profile of the hole transport region HTR including the hole injection layer HIL has a dome shape in which the thickness is greater in the center portion than in the outer periphery, and the thickness profile of the emission layer EML disposed on the hole transport region HTR has a U-shape in which the thickness is smaller in the center portion than in the outer peripheral portion, and accordingly, the light-emitting element may have an increased light-emitting efficiency by about 10% or more compared to a related art light-emitting element.

The light-emitting efficiency may be compared with the light-emitting luminance per unit area in the same color coordinate. In a comparative light-emitting element, which is a comparative example for the light-emitting efficiency, thickness profile of the hole transport region HTR including the hole injection layer HIL has a U-shape in which the thickness is smaller in the center portion than in the outer peripheral portion, and the thickness profile of the emission layer EML disposed on the hole transport region HTR also has a U-shape.

Figure 10A:
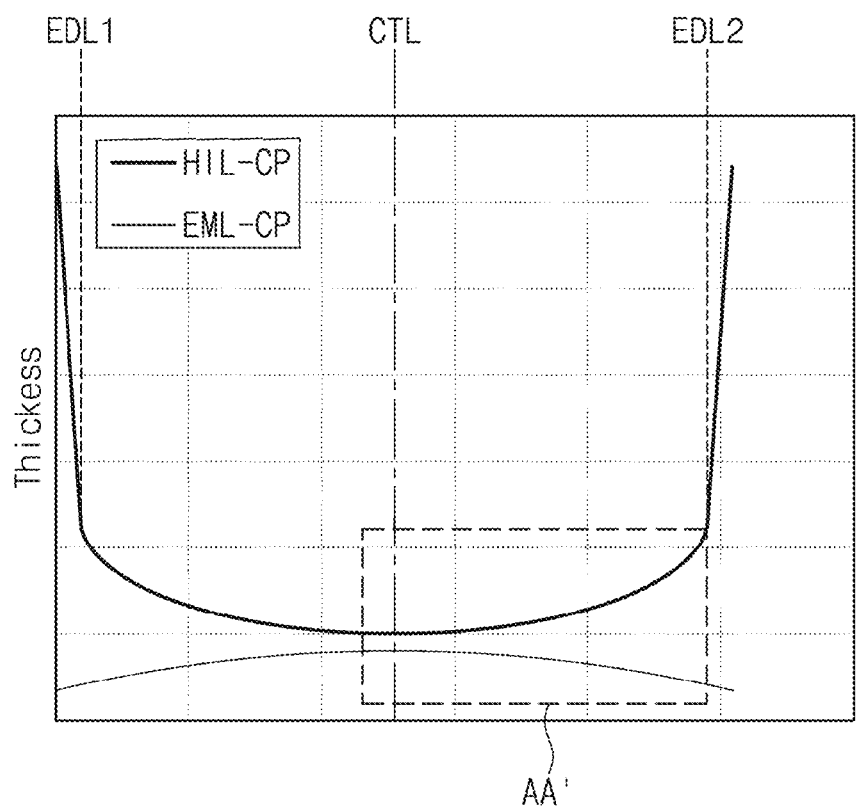
FIG. 10A is a view showing thickness profiles of a hole injection layer and an emission layer of a comparative example.
Figure 10B:
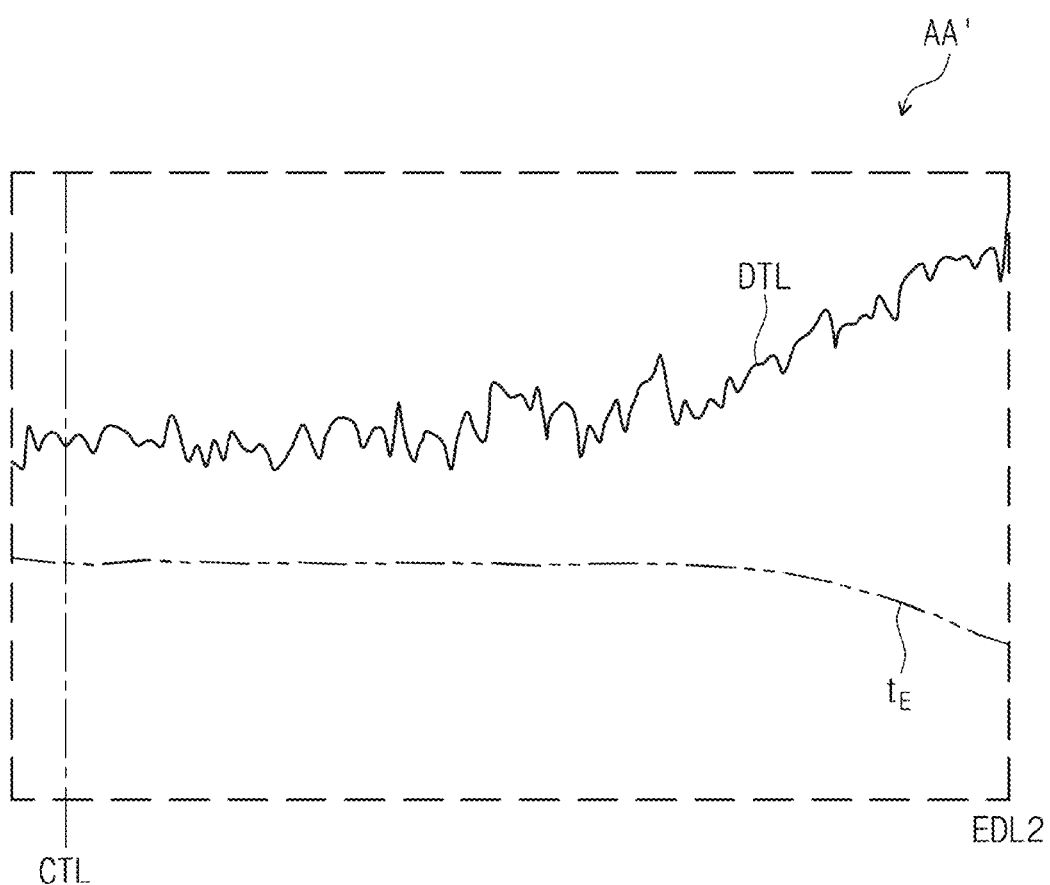
FIG. 10B is a graph showing luminance characteristics in a light-emitting element having the thickness profiles of FIG. 10A.
Figure 11A:
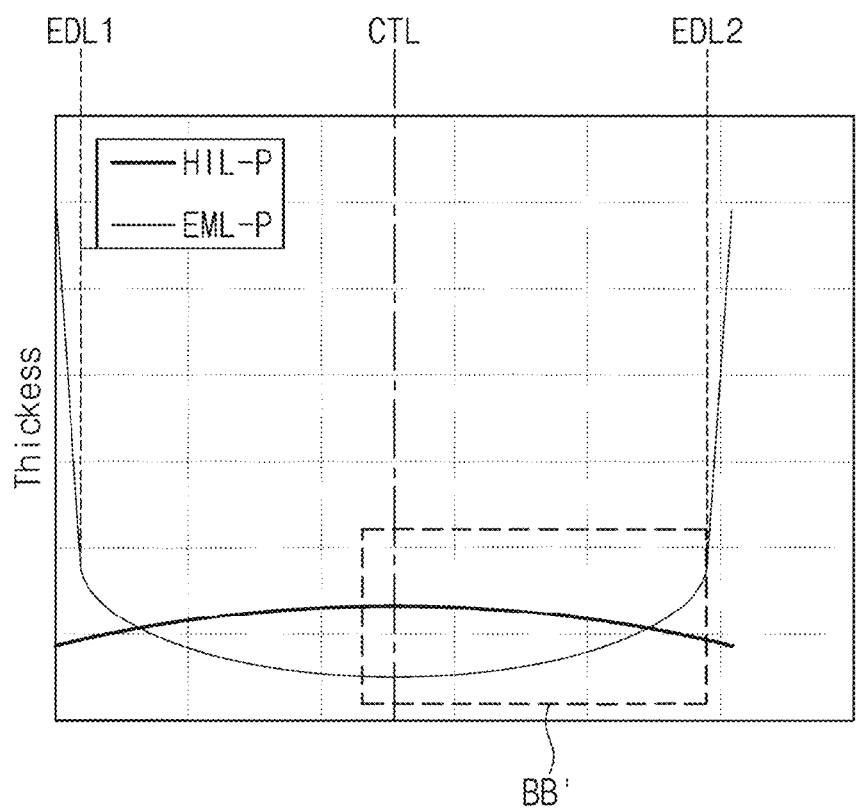
FIG. 11A is a view showing thickness profiles of a hole injection layer and an emission layer according to one or more embodiments of the present disclosure.
Figure 11B:
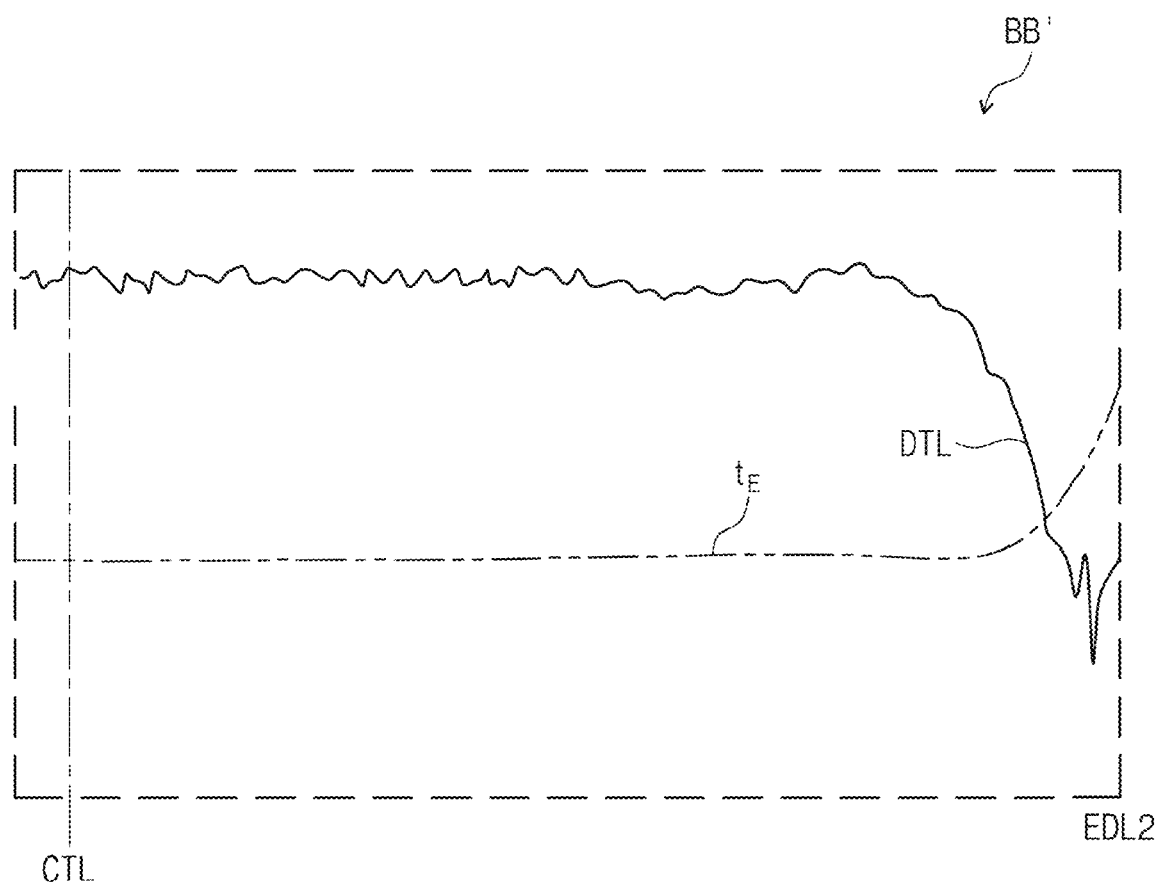
FIG. 11B is a graph showing luminance characteristics in a light-emitting element having the thickness profiles of FIG. 11A.

FIG. 10A is a view illustrating a thickness profile of functional layers in an electronic device of a comparative example, and FIG. 10B is a view illustrating luminance characteristic of a light-emitting region in an electronic device of the comparative example. In addition, FIG. 11A is a view illustrating a thickness profile of functional layers in an electronic device according to an example, and FIG. 11B is a view illustrating a luminance characteristic of a light-emitting region in an electronic device according to the example.

For the comparative example and the example described with reference to FIGS. 10A to 11B, the hole transport region has a stacked structure of a light-emitting element including a hole injection layer and a hole transport layer, as shown in FIG. 9.

FIG. 10B shows an amount of decrease in luminance DTL and the thickness of the emission layer $t_E$ in a region AA' of FIG. 10A. Referring to FIG. 10A and FIG. 10B, for the comparative example, the thickness profile HIL-CP of the hole injection layer is a thick U-shaped in which the thickness of the center portion corresponding to the center line CTL is small, and the thickness of the outer peripheral portion corresponding to the outer peripheral lines EDL1 and EDL2 is thick. In the comparative example, the thickness profile of the emission layer EML-CP has a dome shape with a thick central portion and a thin outer peripheral portion.

The thickness $t_E$ of the emission layer at the outer peripheral line EDL2 portion is smaller than at the center line CTL portion, and the amount of decrease in luminance DTL was also large at the outer peripheral line EDL2 portion. As used in this specification, the amount of decrease in luminance corresponds to a difference value between the initial luminance and the luminance after degradation test, and a large amount of decrease in luminance corresponds to a case in which change in the luminance values before and after the degradation test is large.

The amount of decrease in luminance at the outer peripheral portion compared to the center portion is large for the comparative example, meaning that the luminance decrease due to degradation at the outer peripheral portion is large. Without being bound by any particular theory, it is believed that the current density increases at the outer peripheral portion in which the thickness of the emission layer is relatively small, and thus, the light-emitting efficiency of the light-emitting layer decreases according to the current loss, which results in a decrease in the light-emitting luminance.

FIG. 11B shows an amount of decrease in luminance DTL and the thickness of the emission layer $t_E$ in a region BB' of FIG. 11A. Referring to FIG. 11A and FIG. 11B, the thickness profile HIL-P of the hole injection layer is a thin dome shape in which the thickness at the center line CTL is large and the thickness at the outer peripheral lines EDL1 and EDL2 is small. In one or more embodiments, the thickness profile EML-P of the emission layer is a thick U-shape in which the thickness at the center line CTL is small and the thickness at the outer peripheral lines EDL1 and EDL2 is large.

The thickness $t_E$ of the emission layer was greater at the outer peripheral portion than at the center portion, and the amount of decrease in luminance DTL was also relatively small in the outer peripheral portion. Compared to the comparative example, the amount of decrease in luminance at the outer peripheral portion of the electronic device according to embodiments is small compared to the center portion, which means that the decrease in luminance due to degradation in the outer peripheral portion is small in the example device. For example, the current density decreases at the outer peripheral portion in which the thickness of the emission layer is relatively thick, and thus, the current loss to the non-light emitting region decreases, which results in reducing the amount of decrease in the light-emitting luminance.

Figure 12A:
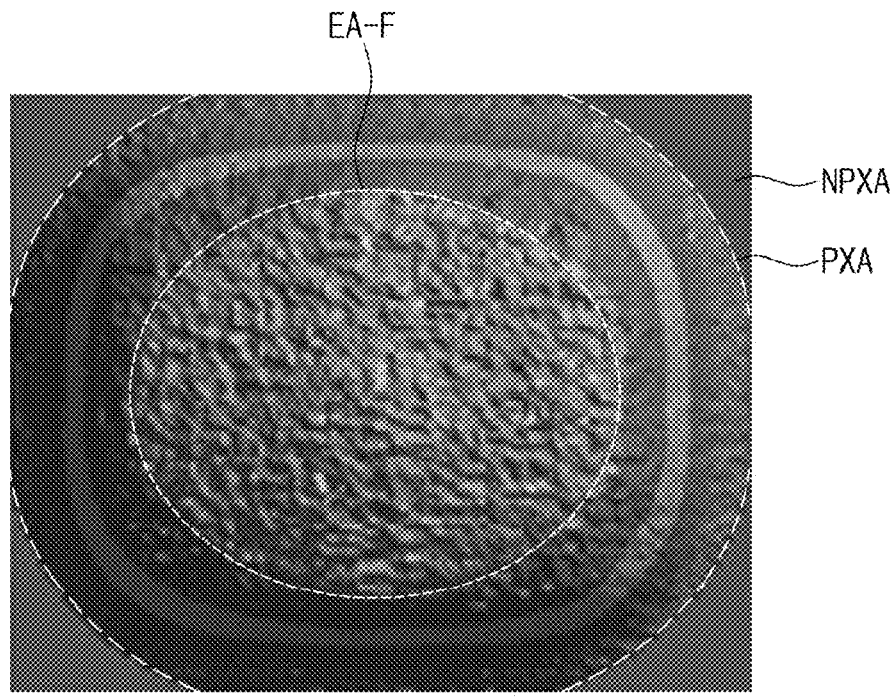
FIG. 12A is an image showing light-emitting characteristics in a comparative example.
Figure 12B:
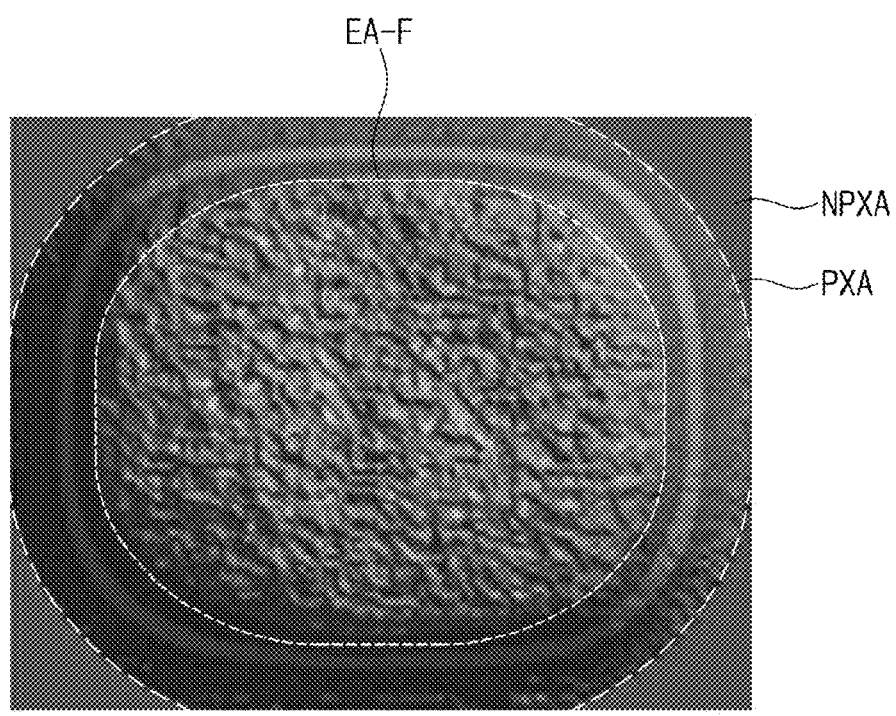
FIG. 12B is an image showing light-emitting characteristics in an example.

FIG. 12A is an image showing light-emitting characteristics of the comparative example electronic device, and FIG. 12B is an image showing light-emitting characteristics of the example electronic device. FIG. 12A and FIG. 12B are images showing a luminance distribution of a light emitting region for the comparative example and example, respectively.

In FIG. 12A and FIG. 12B, "PXA" corresponds to a light-emitting region and "NPXA" corresponds to a non-light emitting region. For example, "PXA" is a light-emitting region separated by the pixel defining layer PDL (FIG. 2), and "NPXA" corresponds to a non-light emitting region corresponding to the pixel defining layer PDL (FIG. 2). In one or more embodiments, "EA-F" corresponds to a luminance region which exhibits uniform (or substantially uniform) light-emitting luminance within the light-emitting region PXA.

It can be seen that, compared to the comparative example, an area of the luminance area EA-F, which exhibits uniform (or substantially uniform) luminance within the light-emitting area PXA, is relatively large in the example device. In one or more embodiments, the comparative example device corresponds to an electronic device including a related art light-emitting element wherein the thickness profile of the hole transport region including the hole injection layer has a U-shape in which the thickness of the center portion is smaller than the thickness of the outer peripheral portion, and the thickness profile of the emission layer disposed on the hole transport region also has a U-shape. In one or more embodiments, as shown in FIG. 9, the example device corresponds to a case wherein the thickness profile of the hole transport region including the hole injection layer has a dome shape in which the thickness is greater in the center portion than in the outer peripheral portion, and the thickness profile of the emission layer disposed on the hole transport region has a U-shape in which the thickness is smaller in the central portion than in the outer peripheral portion.

Referring to FIG. 12A and FIG. 12B, it can be seen that an electronic device with increased light-emitting uniformity may be constituted by optimizing the thickness profile of the hole transport region and the emission layer in the example. In the electronic device according to one or more embodiments of the present disclosure, the hole transport region has a thickness profile with the convex central portion, and the emission layer has a thickness profile with the thin central portion so that an area of a luminance region exhibiting uniform (or substantially uniform) light-emitting characteristics may be increased.

The electronic device according to one or more embodiments of the present disclosure may include a light-emitting element in which thickness profiles of the emission layer and the functional layer below the emission layer are enhanced to increase an area of a region exhibiting uniform (or substantially uniform) light-emitting characteristics within the light-emitting region. In the electronic device according to one or more embodiments of the present disclosure, the leakage current flow to the outer peripheral portion of the light emitting region may be reduced by increasing the thickness of the emission layer from the center to the outer peripheral portion, and thus improved light-emitting efficiency characteristics and light-emitting lifetime characteristics may be achieved.

One or more embodiments of the present disclosure may provide an electronic device including a light-emitting element with an increased light-emitting area in a required (e.g., desired) light-emitting wavelength region by enhanced a thickness profile of a hole transport region and an emission layer sequentially stacked.

In One or more embodiments of the present disclosure may provide an electronic device including a light-emitting element with improved light-emitting uniformity within a light-emitting area and increased lifetime of an element by enhancing a thickness profile of a hole transport region and an emission layer stacked.

Although the embodiments of the present disclosure have been described, it is understood that the present disclosure should not be limited to these embodiments, but various changes and modifications can be made by one ordinary skilled in the art within the spirit and scope of the present disclosure as hereinafter claimed by the following claims and their equivalents.

What is claimed is:

1. An electronic device comprising:
   a base layer;
   a first electrode on the base layer;

a pixel defining layer on the base layer and having an opening that exposes an upper surface of the first electrode;
a hole transport region in the opening and having a thickness gradually decreasing from a center of the opening toward a side surface of the pixel defining layer;
an emission layer directly on the hole transport region and having a thickness gradually increasing from the center of the opening toward the side surface of the pixel defining layer;
an electron transport region on the emission layer; and
a second electrode on the electron transport region,
wherein the emission layer comprises a host and a dopant.

2. The electronic device of claim 1, wherein
a first average thickness in a first portion of the hole transport region is greater than a second average thickness in a second portion of the hole transport region,
the first portion is 60% of a total cross-sectional area of the hole transport region, with a virtual center line passing through the center of the hole transport region as the center line of the total cross-sectional area in the thickness direction of the hole transport region,
the second portion is 80% of the total cross-sectional area of the hole transport region, and
wherein a value of the first average thickness is a cross-sectional area of the first portion divided by a width of the first portion, and a value of the second average thickness is a cross-sectional area of the second portion dived by a width of the second portion.

3. The electronic device of claim 2, wherein
an upper surface of the hole transport region is a curved surface convex toward the emission layer.

4. The electronic device of claim 1, wherein
a first average thickness in a first portion of the emission layer is smaller than a second average thickness in a second portion of the emission layer,
the first portion is 60% of a total cross-sectional area of the emission layer, with a virtual center line passing through the center of the emission layer as the center line of the total cross-sectional area in the thickness direction of the emission layer,
the second portion is 80% of the total cross-sectional area of the emission layer, and
wherein a value of the first average thickness is a cross-sectional area of the first portion divided by a width of the first portion, and a value of the second average thickness is a cross-sectional area of the second portion divided by a width of the second portion.

5. The electronic device of claim 4, wherein
a lower surface of the emission layer is a curved surface concave toward an upper surface of the emission layer, and
the upper surface of the emission layer is a flat surface.

6. The electronic device of claim 1, wherein
a percentage difference between
 a sum of a thickness of a first portion of the hole transport region measured at a virtual center line, which passes through the center of the opening and is normal to the first electrode, and a thickness of a second portion of the emission layer measured at the virtual center line, and
 a sum of a thickness of a third portion of the hole transport region and a thickness of a fourth portion of the emission layer respectively measured at a virtual outer peripheral line parallel to the virtual center line,
is less than about 10%.

7. The electronic device of claim 1, wherein the hole transport region comprises
a hole injection layer on the first electrode; and
a hole transport layer on the hole injection layer,
the hole injection layer and having a thickness gradually decreasing from the center of the opening toward the side surface of the pixel defining layer.

8. The electronic device of claim 7, wherein
the hole transport layer has a thickness gradually decreasing from the center of the opening toward the side surface of the pixel defining layer.

9. The electronic device of claim 7, wherein
an upper surface of the hole injection layer is a curved surface convex toward the emission layer, and
an upper surface of the hole transport layer is a curved surface convex toward the emission layer.

10. The electronic device of claim 1, wherein
a resistivity of the hole transport region is lower than a resistivity of the emission layer.

11. The electronic device of claim 10, wherein
the resistivity of the emission layer is about 10 times to about 100 times the resistivity of the hole transport region.

12. The electronic device of claim 1, wherein
the side surface of the pixel defining layer defining the opening is hydrophobic.

13. The electronic device of claim 1, wherein
the hole transport region and the emission layer are provided by an inkjet printing method, and
the electron transport region is provided by a deposition method.

14. An electronic device comprising:
a pixel defining layer in which a plurality of openings spaced apart from each other on a plane are defined; and
a plurality of light-emitting elements comprising at least one functional layer in each of the plurality of openings,
wherein each of the plurality of light-emitting elements comprises:
a first electrode, at least a portion of the first electrode being in direct contact with at least a portion of the pixel defining layer;
a hole transport region on the first electrode and being greater in thickness at a center of the hole transport region than at an outer periphery thereof;
an emission layer on the hole transport region and being smaller in thickness at a center of the emission layer than at an outer periphery thereof;
an electron transport region on the emission layer; and
a second electrode on the electron transport region, and
wherein the center of the hole transport region and the center of the emission layer respectively correspond to a point that passes through a virtual center line normal to the first electrode, and the outer periphery of the hole transport region and the outer periphery of the emission layer respectively correspond to a point spaced apart from the center toward the pixel defining layer.

15. The electronic device of claim 14, wherein
the at least one functional layer is provided by an inkjet printing method.

16. The electronic device of claim 14, wherein
an upper surface of the hole transport region is a curved surface convex toward the emission layer.

17. The electronic device of claim 16, wherein
a shape of a lower surface of the emission layer corresponds to a shape of the upper surface of the hole transport region, and
an upper surface of the emission layer is a flat surface.

18. The electronic device of claim 16, wherein
in the plurality of openings, a difference between a first thickness from the first electrode to an upper portion of the emission layer at a center of an opening of the plurality of openings and a second thickness from the first electrode to the upper portion of the emission layer at an outer periphery of the opening is less than about 10%.

19. An electronic device comprising a plurality of light-emitting elements,
each of the plurality of light-emitting elements comprising:
a first electrode;
a hole transport region on the first electrode;
an emission layer directly on the hole transport region, the emission layer comprising a host and a dopant;
an electron transport region on the emission layer; and
a second electrode on the electron transport region,
wherein a first thickness of the hole transport region, which is a distance between the first electrode and the emission layer, decreases from a center of the hole transport region to an outer periphery thereof, and
a second thickness of the emission layer, which is a distance between the hole transport region and the electron transport region, increases from a center of the emission layer to an outer periphery thereof.

20. The electronic device of claim 19, wherein
an upper surface of the hole transport region is a curved surface convex toward the emission layer, and
a shape of a lower surface of the emission layer corresponds to a shape of the upper surface of the hole transport region, and an upper surface of the emission layer is a flat surface.

\* \* \* \* \*